United States Patent
Hisamoto et al.

(10) Patent No.: US 10,062,759 B2
(45) Date of Patent: Aug. 28, 2018

(54) SILICON CARBIDE SEMICONDUCTOR DEVICE AND METHOD FOR MANUFACTURING SAME

(71) Applicant: HITACHI, LTD., Chiyoda-ku, Tokyo (JP)

(72) Inventors: Digh Hisamoto, Tokyo (JP); Keisuke Kobayashi, Tokyo (JP); Naoki Tega, Tokyo (JP); Toshiyuki Ohno, Tokyo (JP); Hirotaka Hamamura, Tokyo (JP); Mieko Matsumura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/778,058

(22) PCT Filed: Mar. 29, 2013

(86) PCT No.: PCT/JP2013/059449
§ 371 (c)(1),
(2) Date: Sep. 17, 2015

(87) PCT Pub. No.: WO2014/155651
PCT Pub. Date: Oct. 2, 2014

(65) Prior Publication Data
US 2016/0111499 A1  Apr. 21, 2016

(51) Int. Cl.
*H01L 29/15* (2006.01)
*H01L 29/16* (2006.01)
(Continued)

(52) U.S. Cl.
CPC .... *H01L 29/1608* (2013.01); *H01L 21/02236* (2013.01); *H01L 21/02255* (2013.01);
(Continued)

(58) Field of Classification Search
CPC .................................................. H01L 29/1608
See application file for complete search history.

(56) References Cited

U.S. PATENT DOCUMENTS 6,841,436 B2   1/2005  Hisada et al.
2003/0227052 A1  12/2003  Ono et al.
(Continued)

FOREIGN PATENT DOCUMENTS

JP   2003-124208 A   4/2003
JP   2006-210818 A   8/2006
(Continued)

OTHER PUBLICATIONS

Zheleva, T. et al.; "Transition layers at the $SiO_2$/SiC interface", Applied Physics Letters 93, Feb. 21, 2008, (2008).
(Continued)

*Primary Examiner* — Marc Armand
*Assistant Examiner* — Sarah Salerno
(74) *Attorney, Agent, or Firm* — Miles & Stockbridge P.C.

(57) ABSTRACT

A MOSFET using a SiC substrate has a problem that a carbon-excess layer is formed on a surface by the application of mechanical stress due to thermal oxidation and the carbon-excess layer degrades mobility of channel carriers. In the invention, (1) a layer containing carbon-carbon bonds is removed; (2) a gate insulating film is formed by a deposition method; and (3) an interface between a crystal surface and the insulating film is subjected to an interface treatment at a low temperature for a short time. Due to this, the carbon-excess layer causing characteristic degradation is effectively eliminated, and at the same time, dangling bonds can be effectively eliminated by subjecting an oxide film and an oxynitride film to an interface treatment.

5 Claims, 25 Drawing Sheets

(51) Int. Cl.
   *H01L 21/04*    (2006.01)
   *H01L 29/66*    (2006.01)
   *H01L 29/872*   (2006.01)
   *H01L 29/06*    (2006.01)
   *H01L 21/02*    (2006.01)
   *H01L 29/10*    (2006.01)
   *H01L 29/78*    (2006.01)

(52) U.S. Cl.
   CPC .......... *H01L 21/045* (2013.01); *H01L 21/049* (2013.01); *H01L 21/0475* (2013.01); *H01L 29/0619* (2013.01); *H01L 29/1033* (2013.01); *H01L 29/66068* (2013.01); *H01L 29/78* (2013.01); *H01L 29/872* (2013.01)

(56) References Cited

U.S. PATENT DOCUMENTS

| | | | | |
|---|---|---|---|---|
| 2010/0221917 A1* | 9/2010 | Masuda | ............... | H01J 37/3244 438/692 |
| 2012/0199846 A1* | 8/2012 | Shimizu | ............ | H01L 29/66068 257/77 |
| 2012/0223338 A1* | 9/2012 | Mitani | .............. | H01L 21/02178 257/77 |
| 2014/0057461 A1* | 2/2014 | Shiomi | ................. | H01L 21/324 438/796 |

FOREIGN PATENT DOCUMENTS

| | | |
|---|---|---|
| JP | 2006-216918 A | 8/2006 |
| JP | 2009-16530 A | 1/2009 |
| JP | 2010-251589 A | 11/2010 |

OTHER PUBLICATIONS

Chokawa, K. et al.; "A New-Type of C—C Defect Generation at a 4H-SiC/SiO$_2$ Interface by Oxidation Induced Compressive Strain", 9 European Conference on Silicon Carbide and Related Materials (ECSCRM2012), We6-3, 2012.

Okada, H. et al.; "Angle-Resolved XPS Studies on Transition Layers at SiO$_2$/SiC Interfaces", Spring Meeting 2012 of The Japan Society of Applied Physics, 17a-DP5-1.

Okada, H. et al.; "Estimation of Depth Profile of C in oxide for SiO$_2$/4H-SiC using HAX-PES" Technical Meeting 2012 of The Japan Society of Applied Physics, 11p-PB2-8.

Office Action dated Nov. 29, 2016 for related Japanese Patent Application No. 2015-507858.

Office Action dated Jul. 10, 2018 for German patent application No. 11 2013 006 715.3.

* cited by examiner

[FIG. 1]
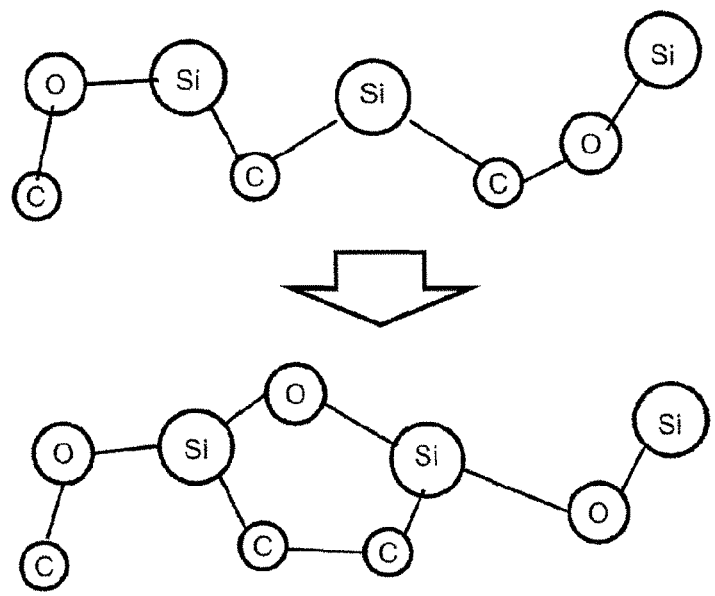
[FIG. 2]
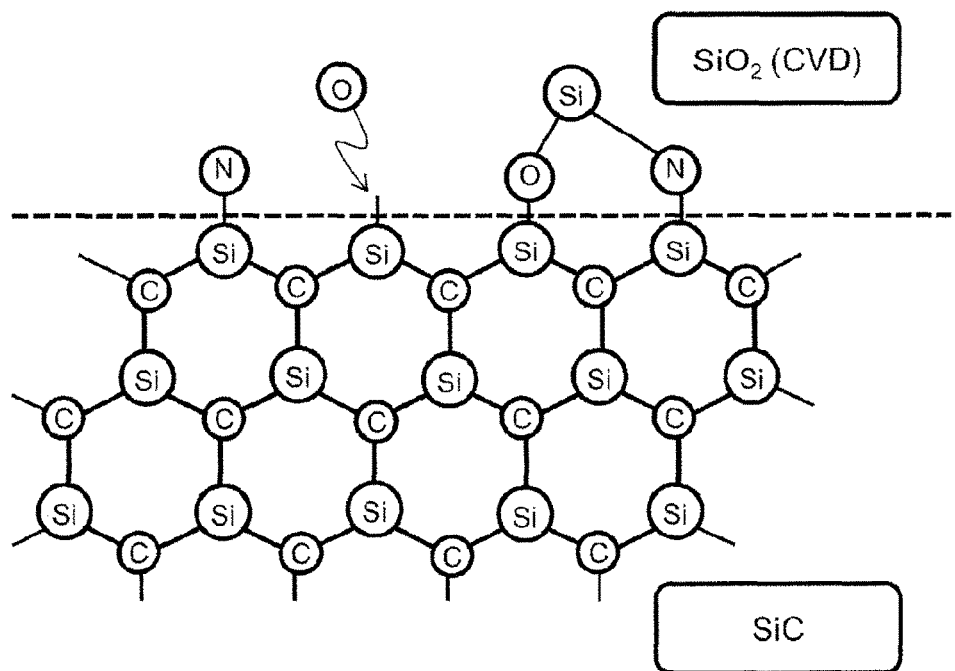

[FIG. 3]
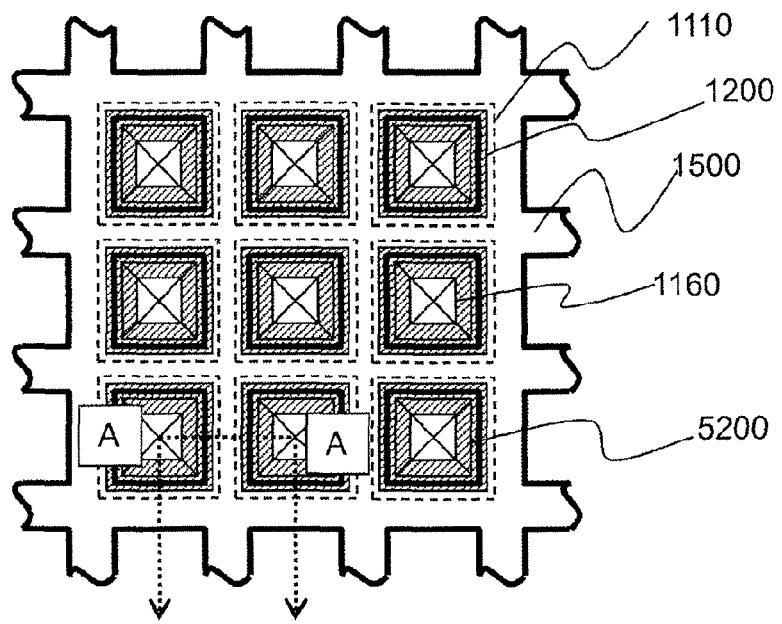
[FIG. 4]
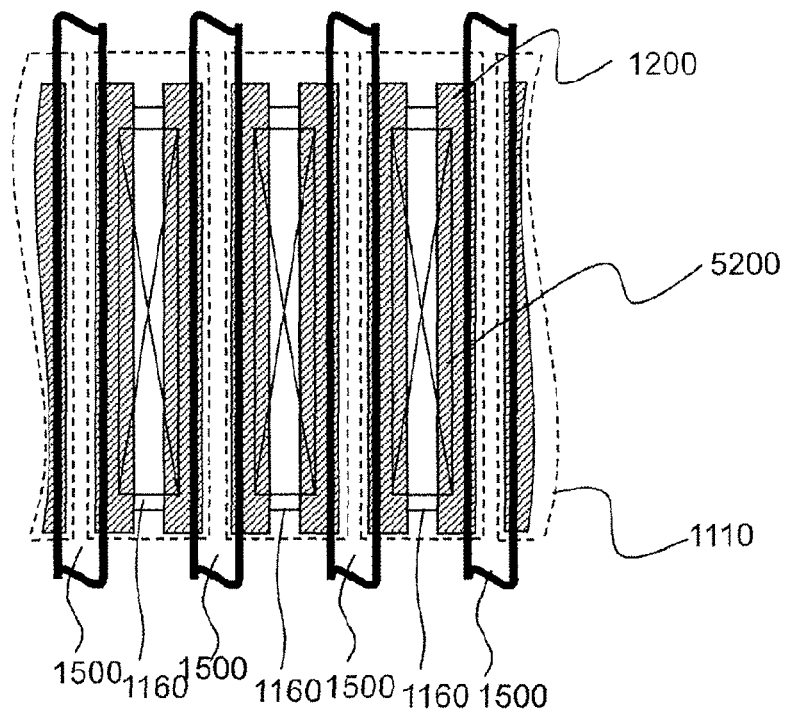

[FIG. 5]
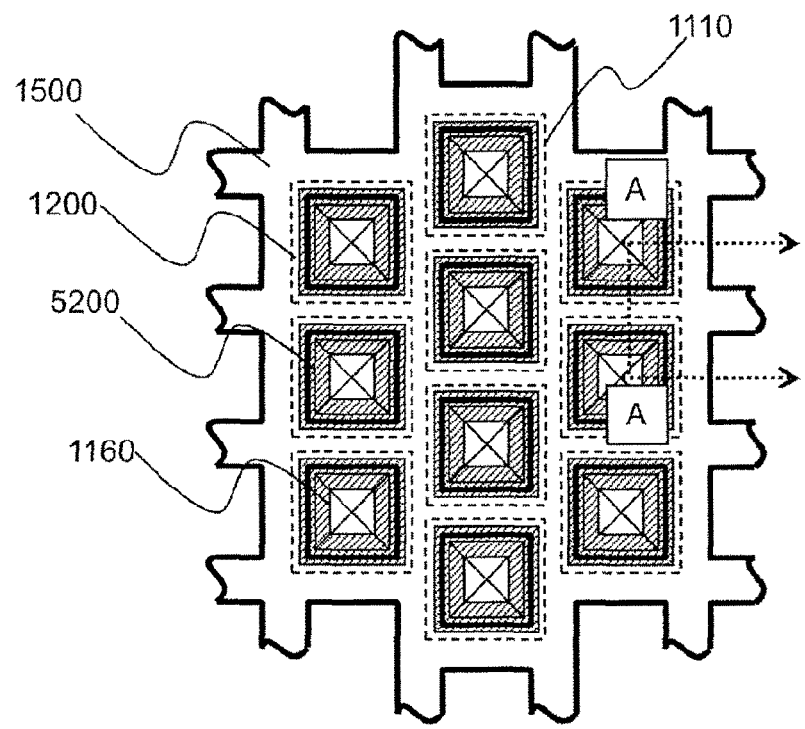
[FIG. 6]
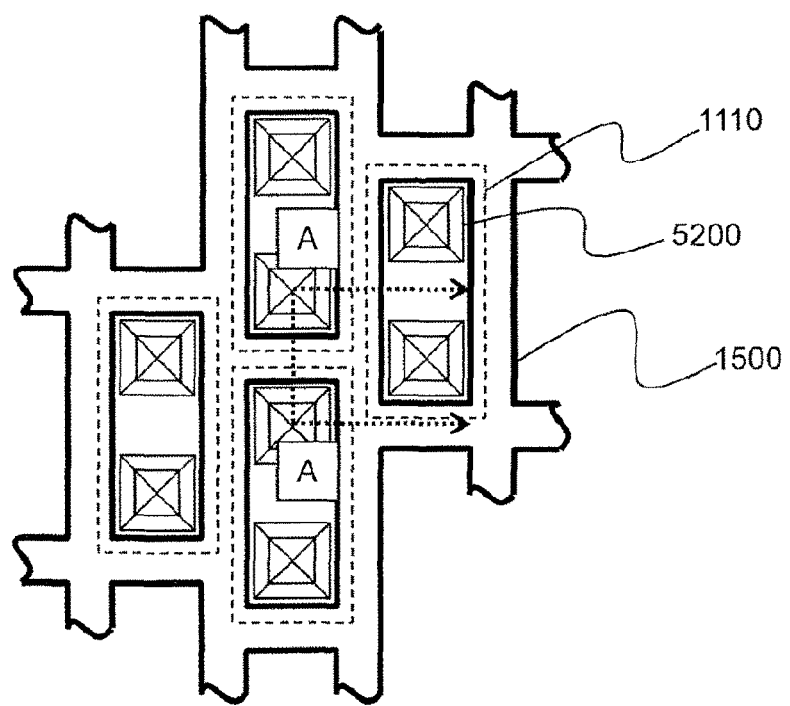

[FIG. 7]
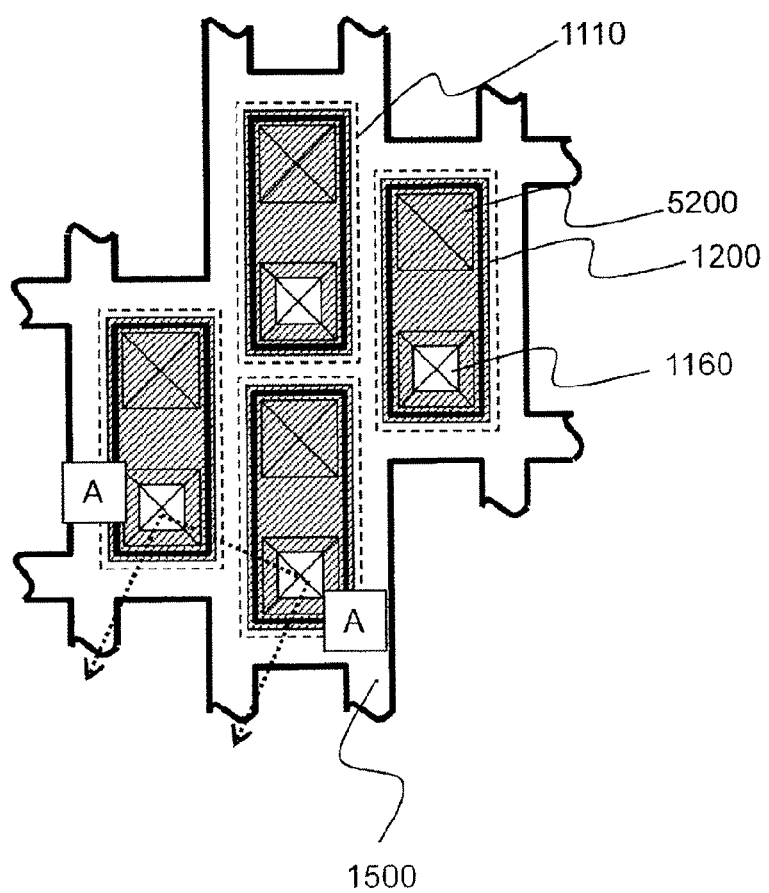

[FIG. 8]
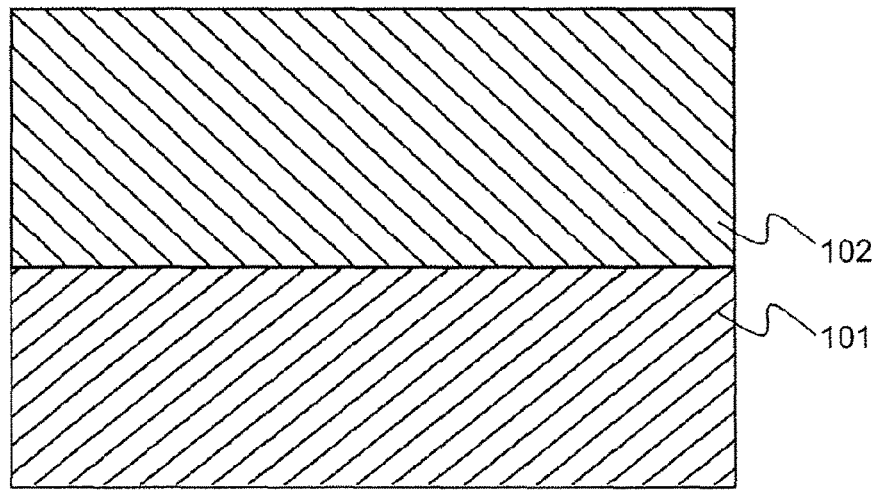
[FIG. 9]
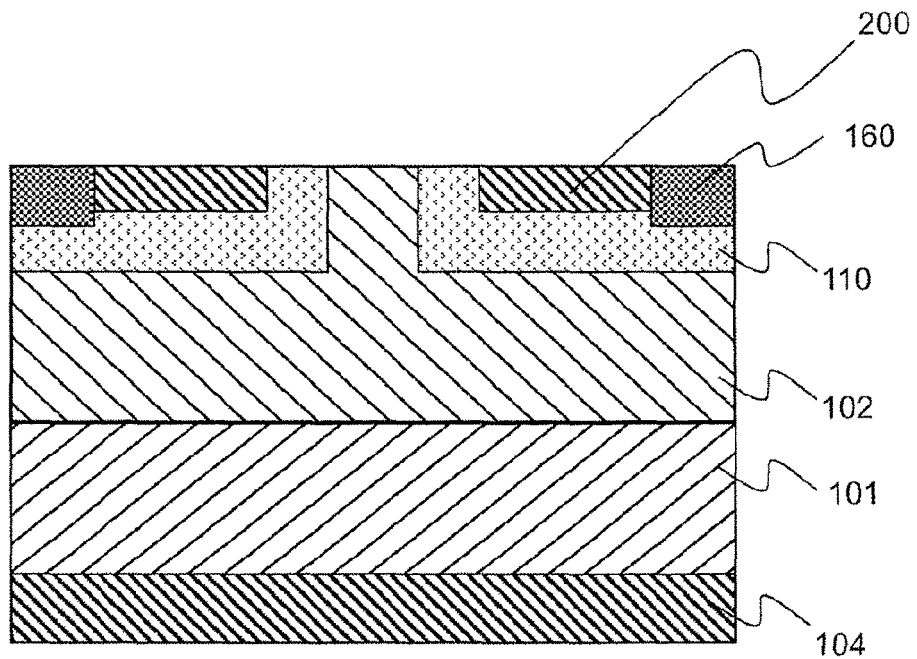

[FIG. 10]
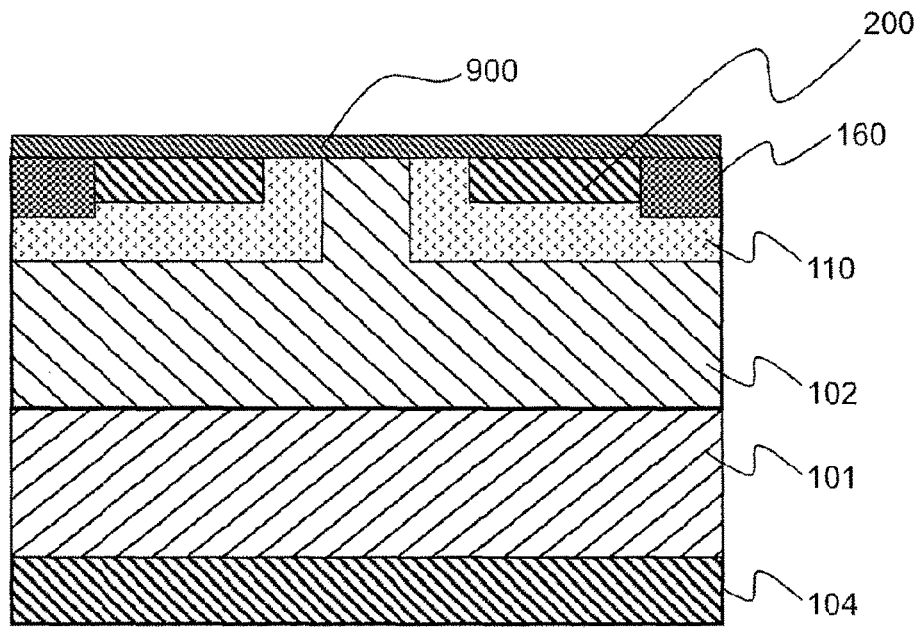
[FIG. 11]
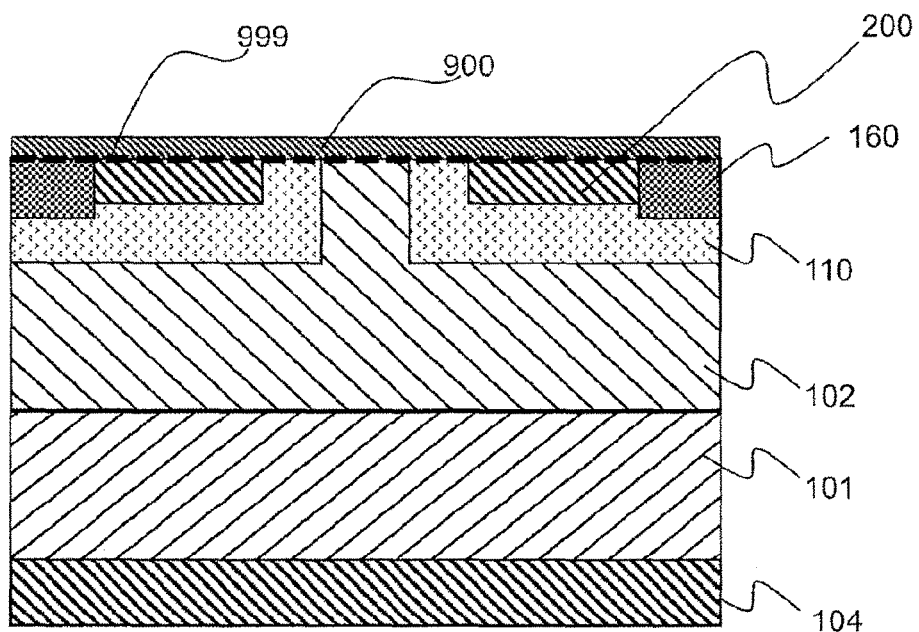

[FIG. 12]
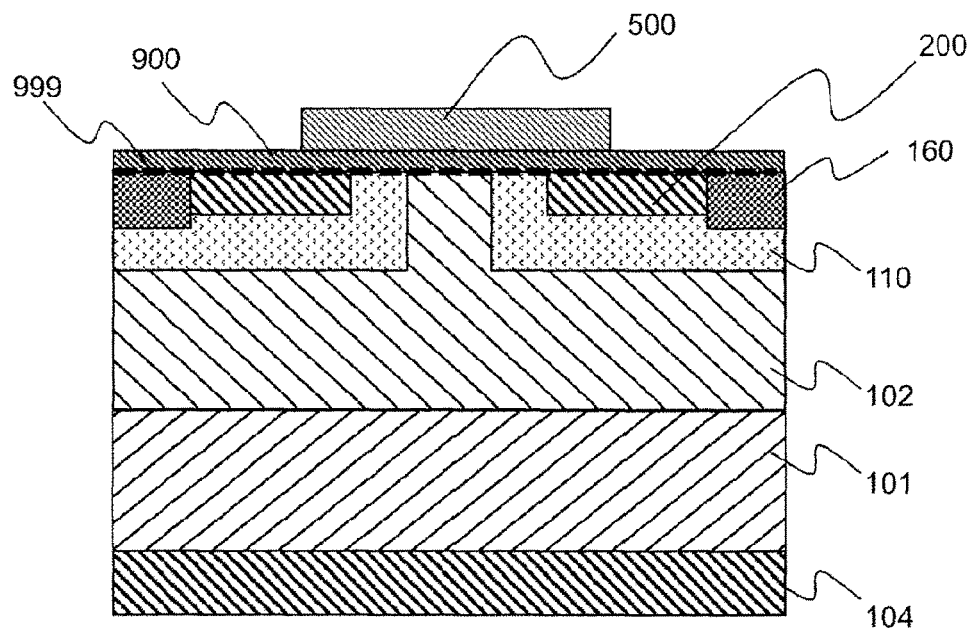
[FIG. 13]
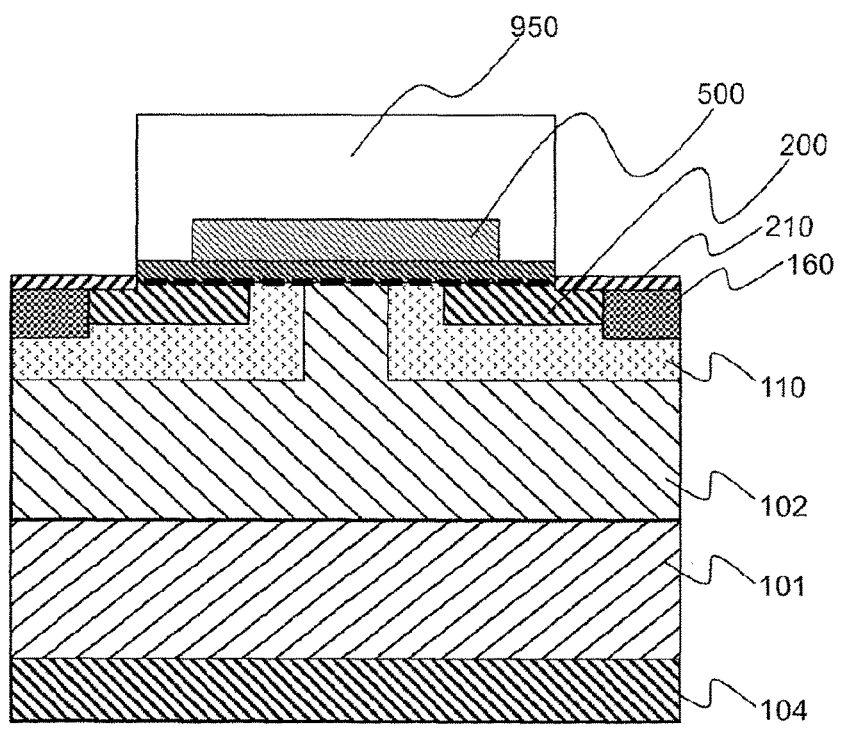

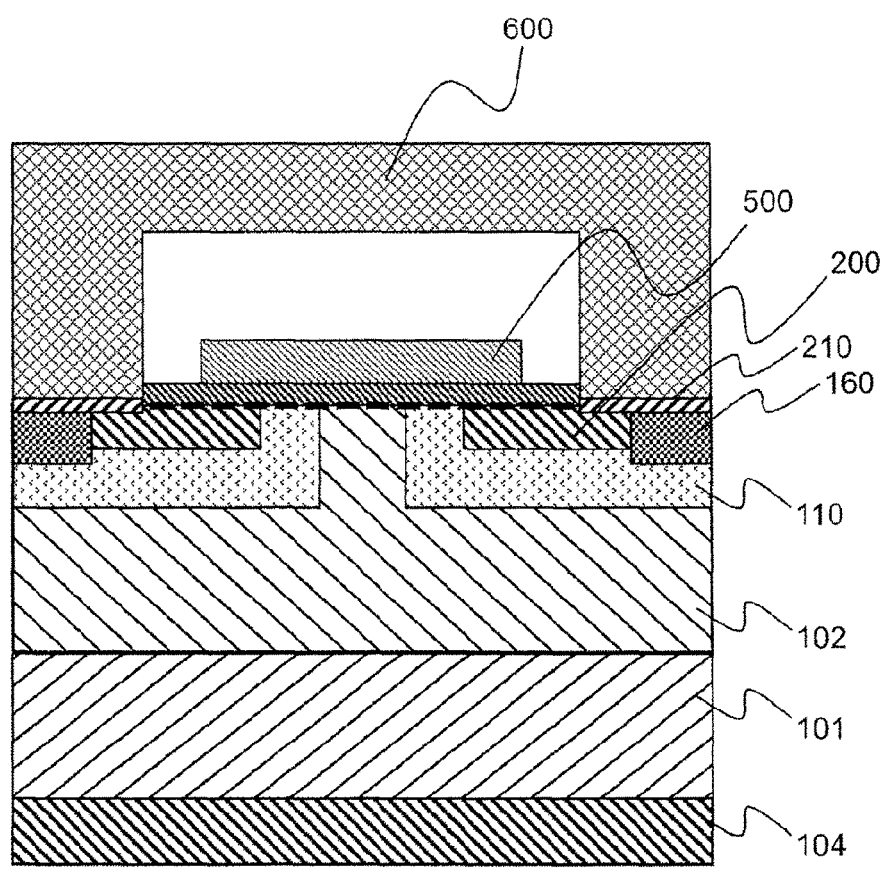
[FIG. 14]

[FIG. 15]
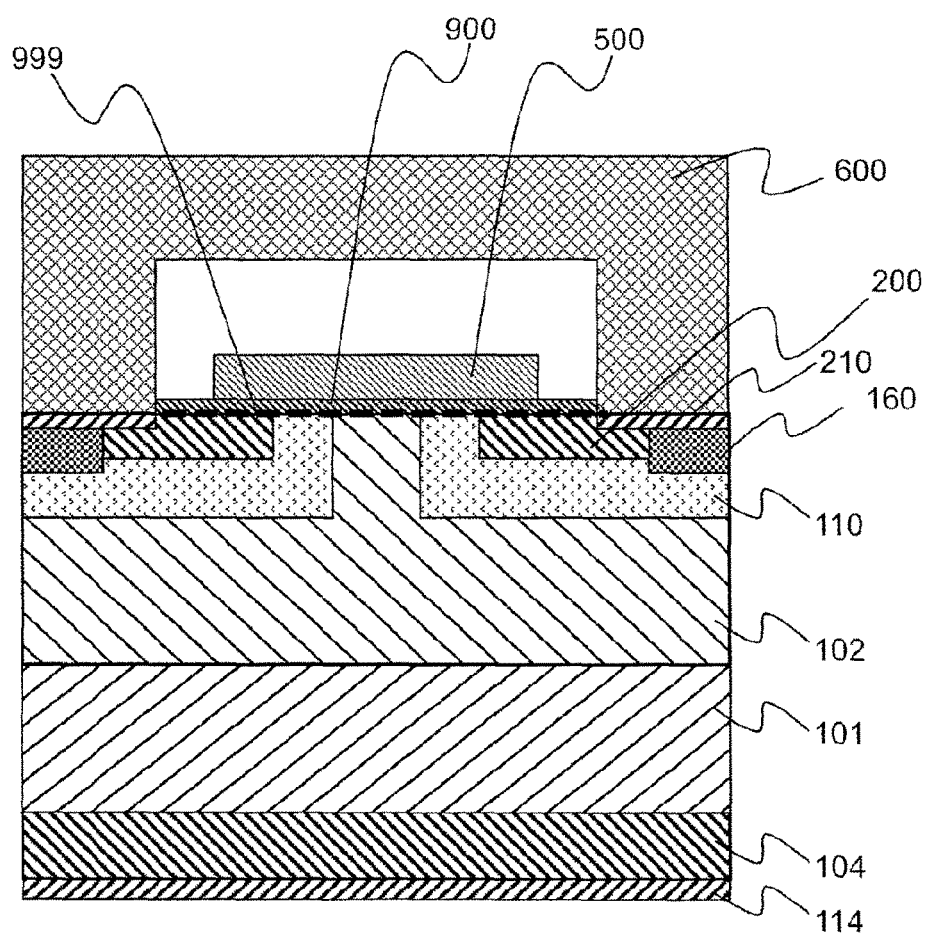

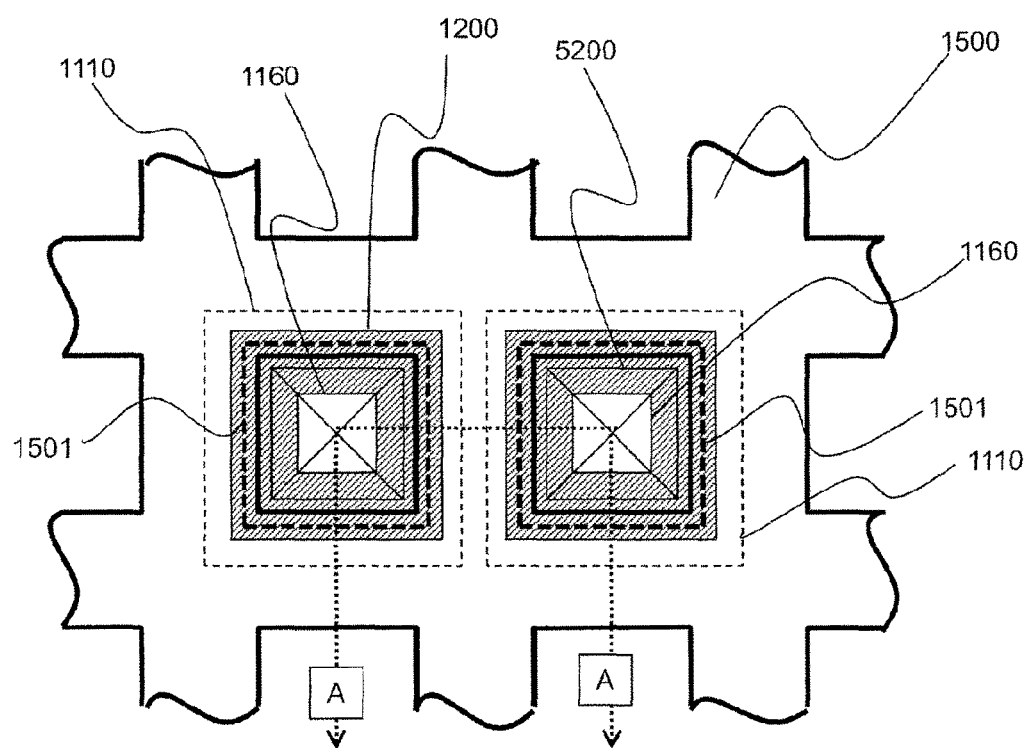
[FIG. 16]

[FIG. 17]
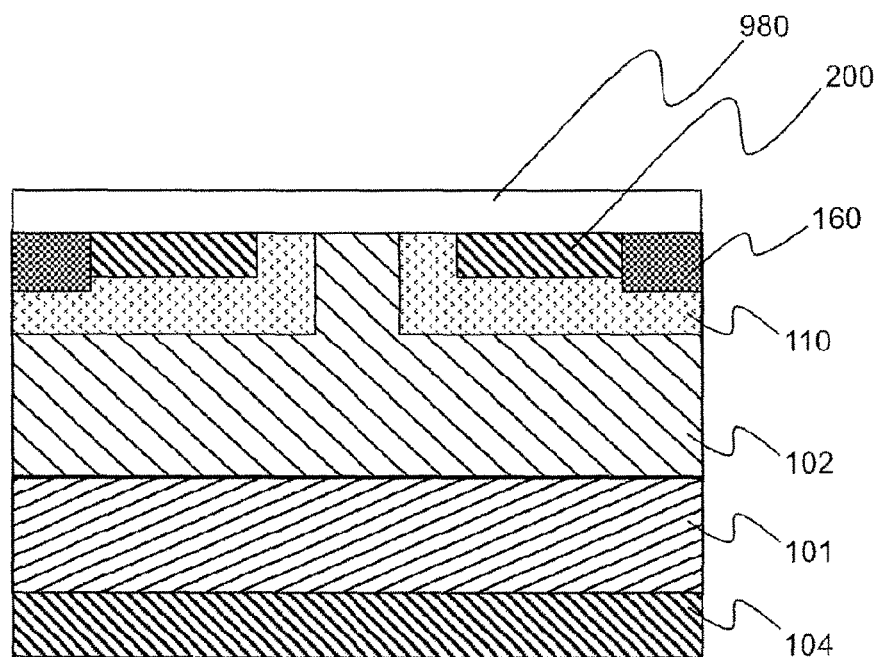

[FIG. 18]
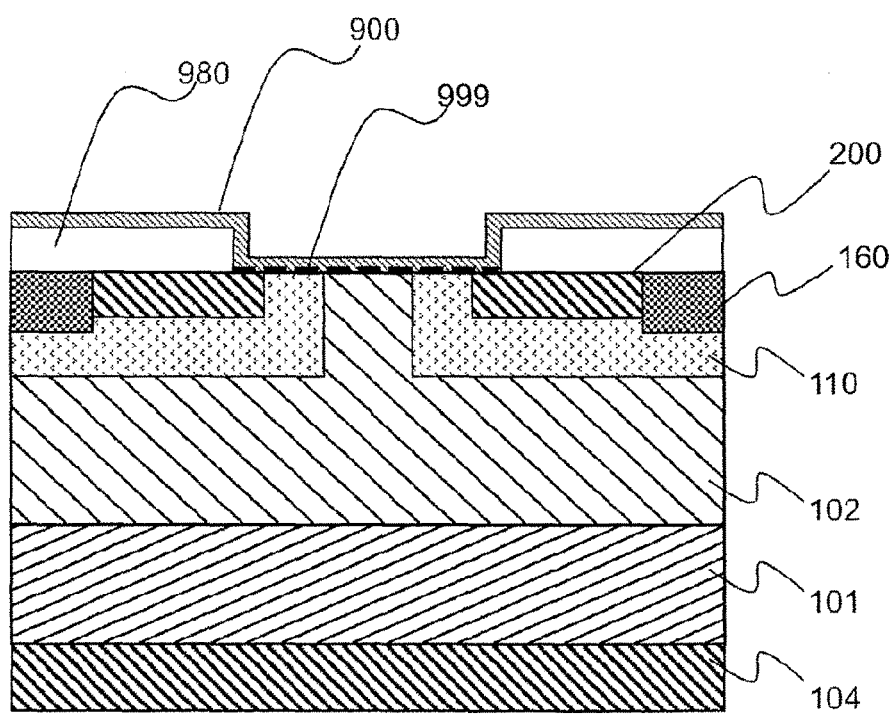

[FIG. 19]
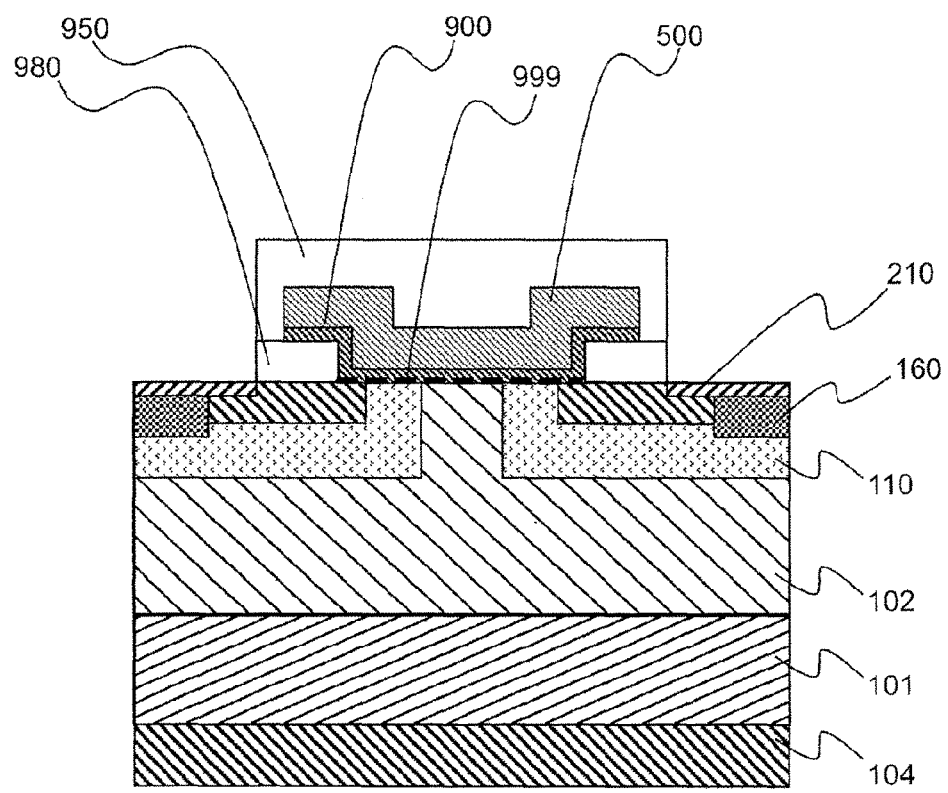

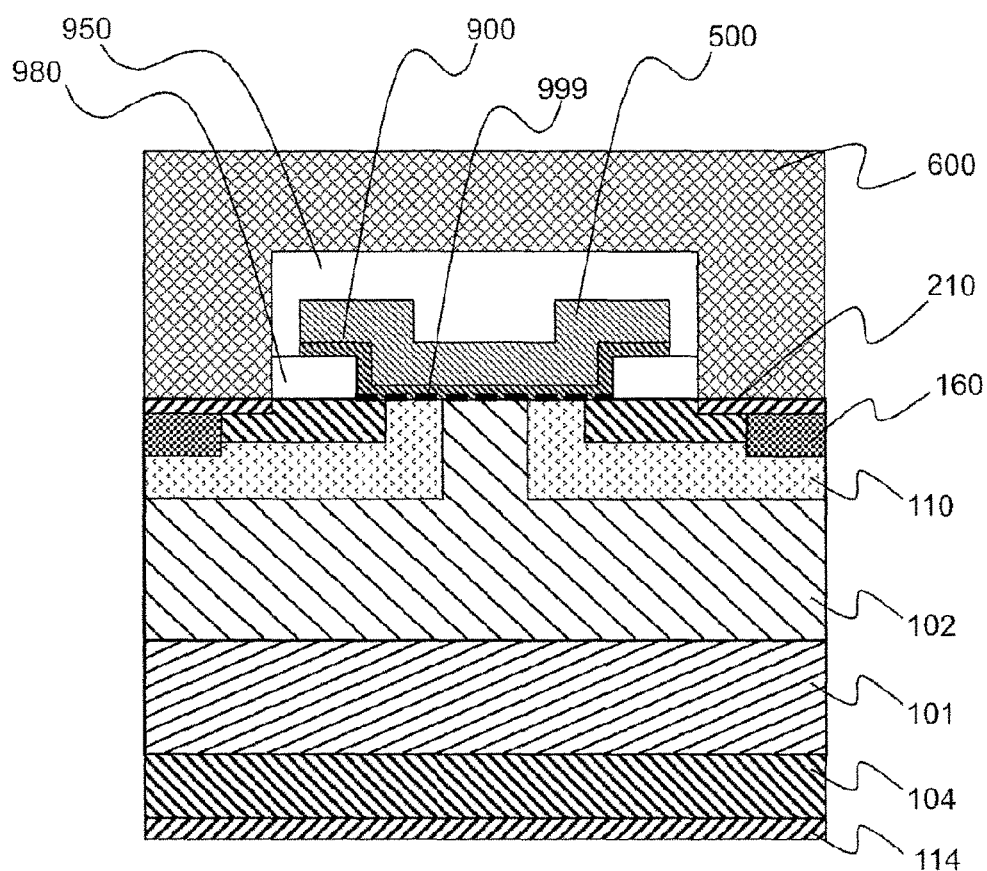
[FIG. 20]

[FIG. 21]
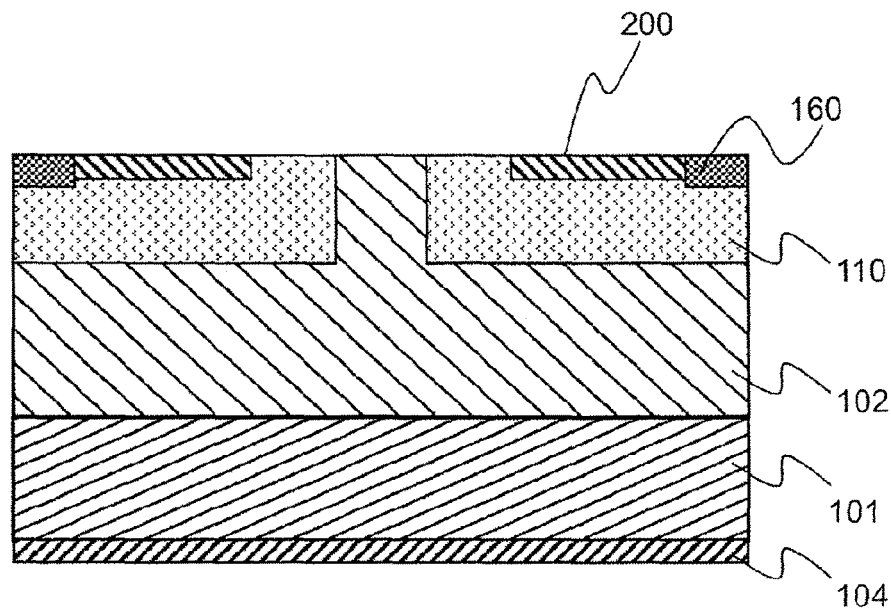
[FIG. 22]
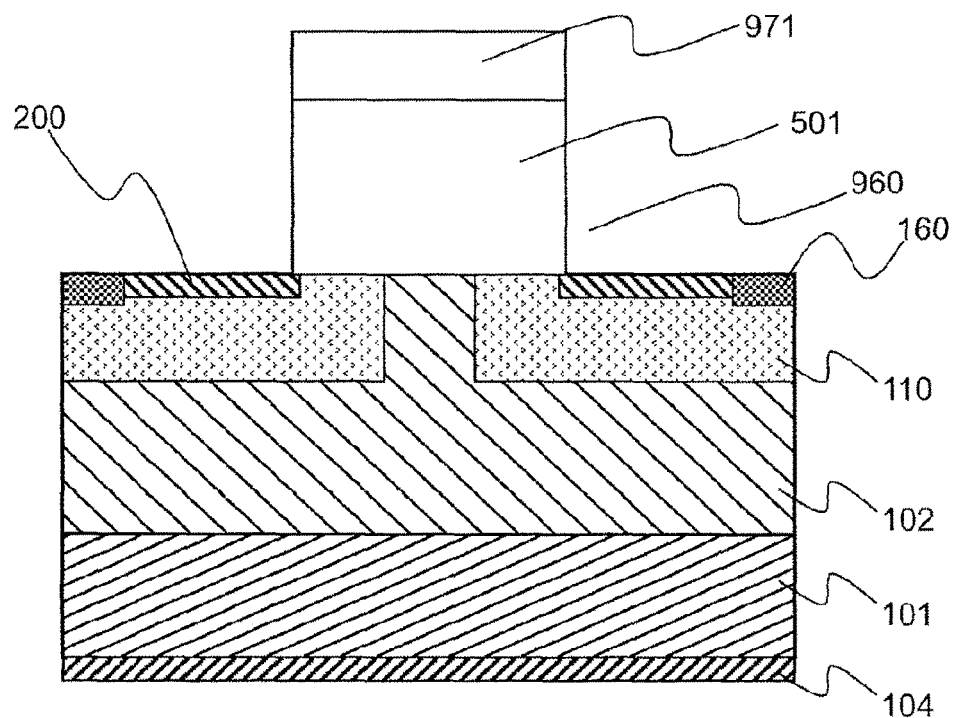

[FIG. 23]
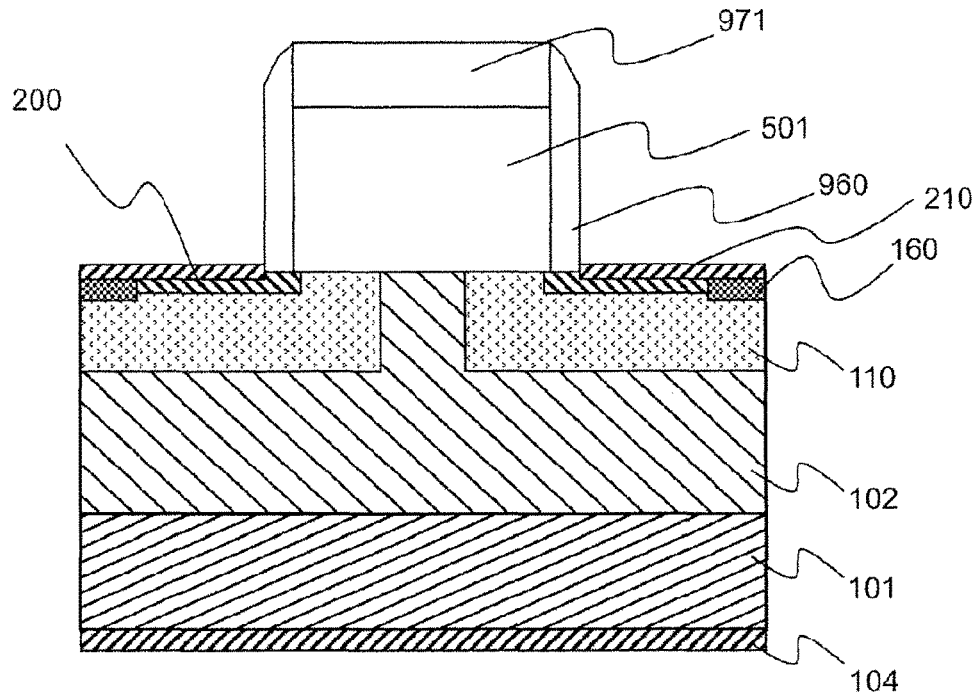
[FIG. 24]
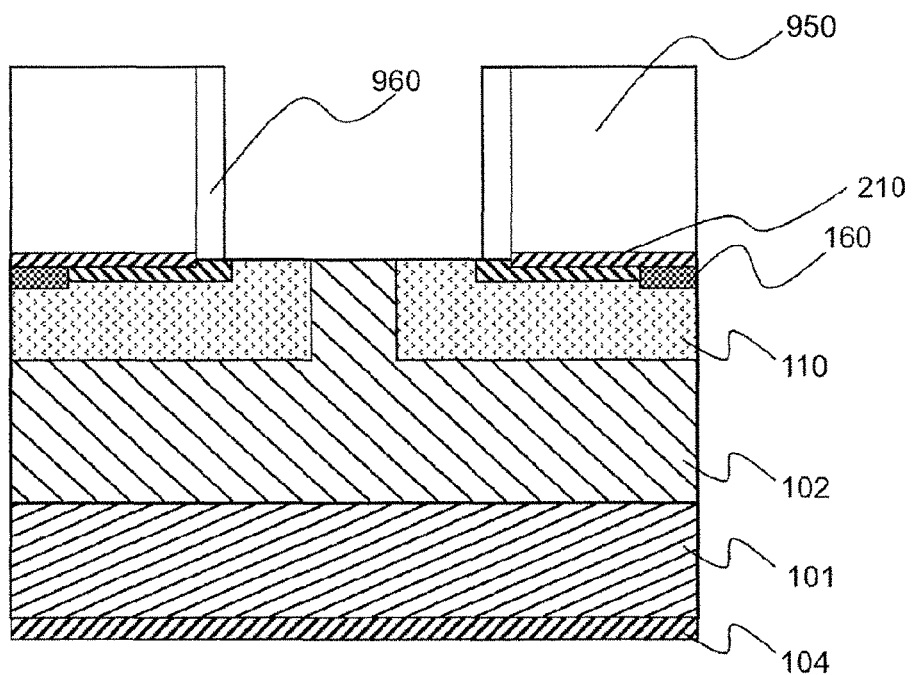

[FIG. 25]
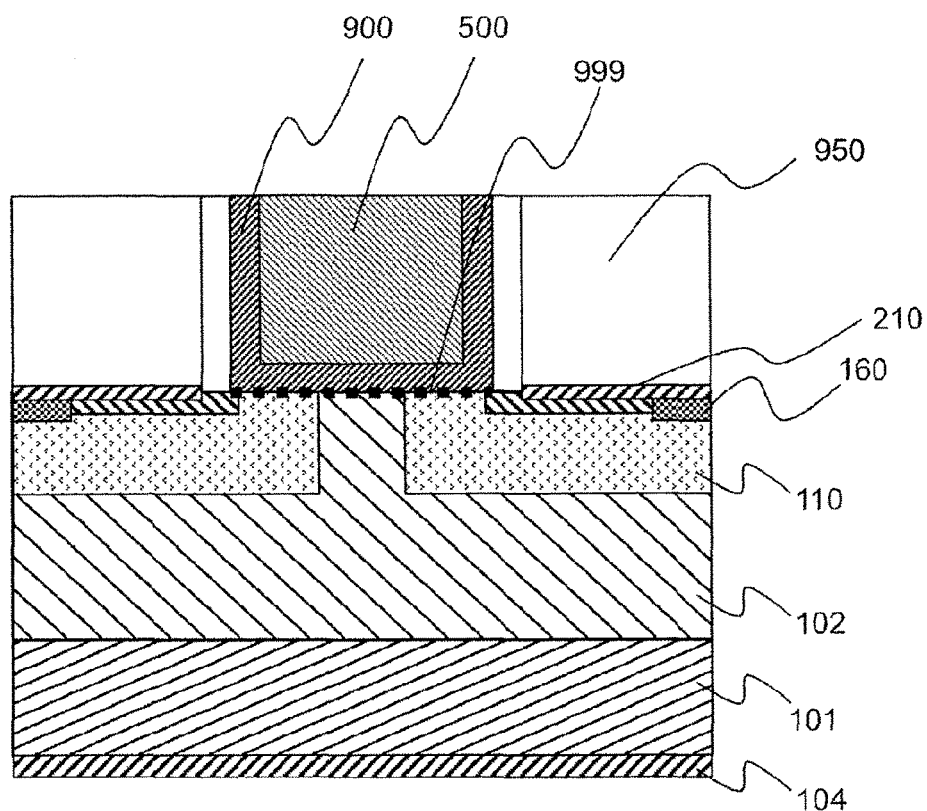

[FIG. 26]
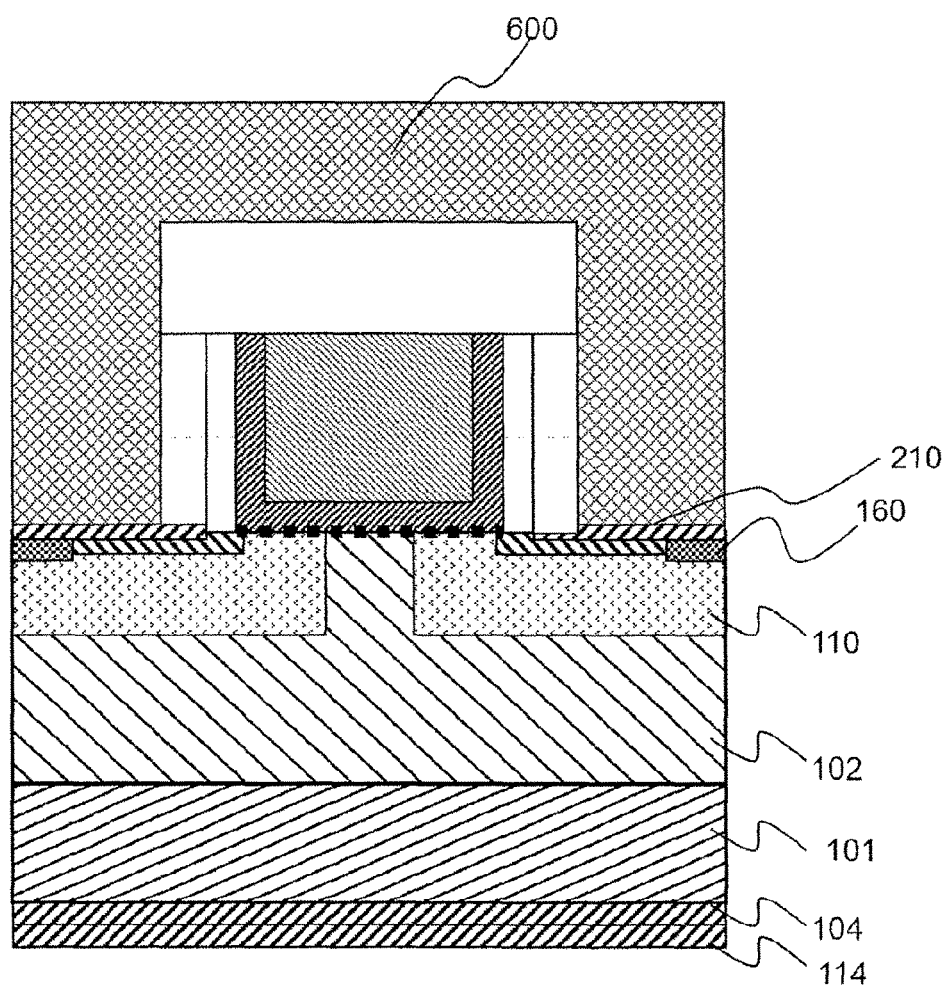

[FIG. 27]
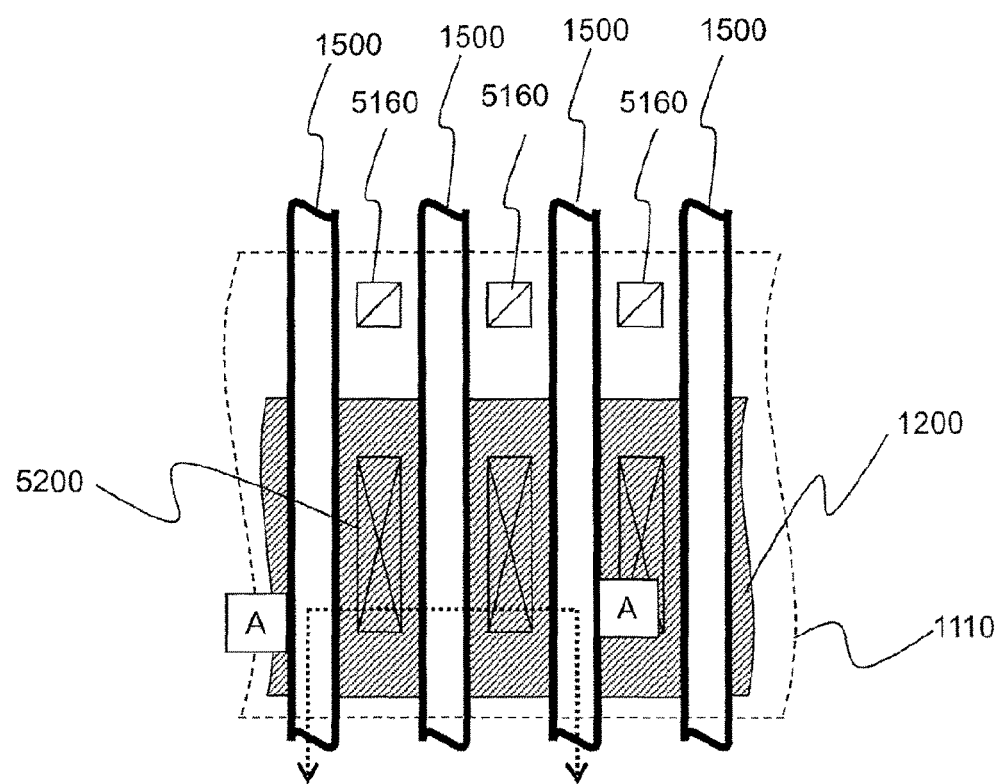

[FIG. 28]
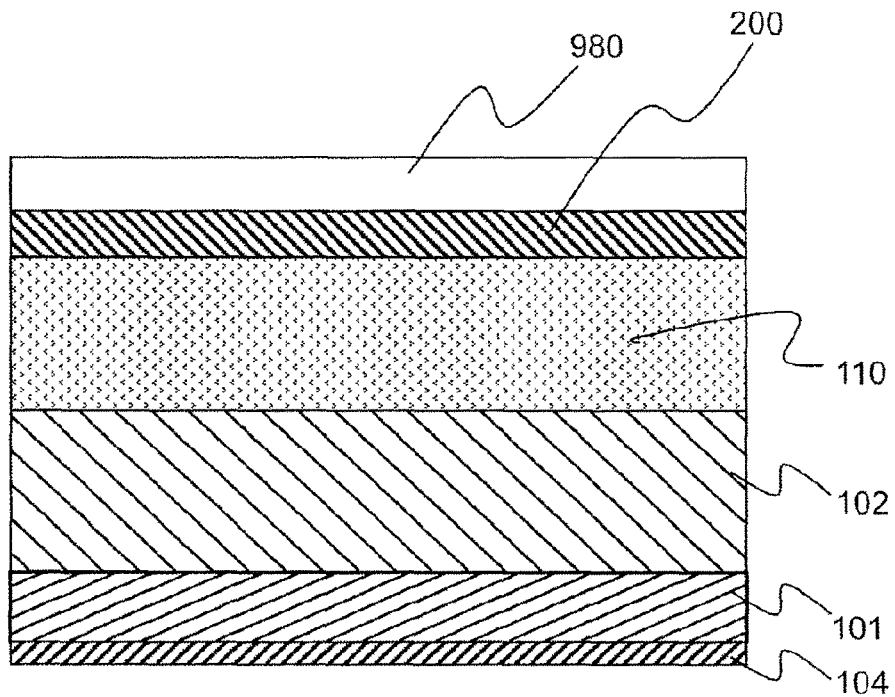
[FIG. 29]
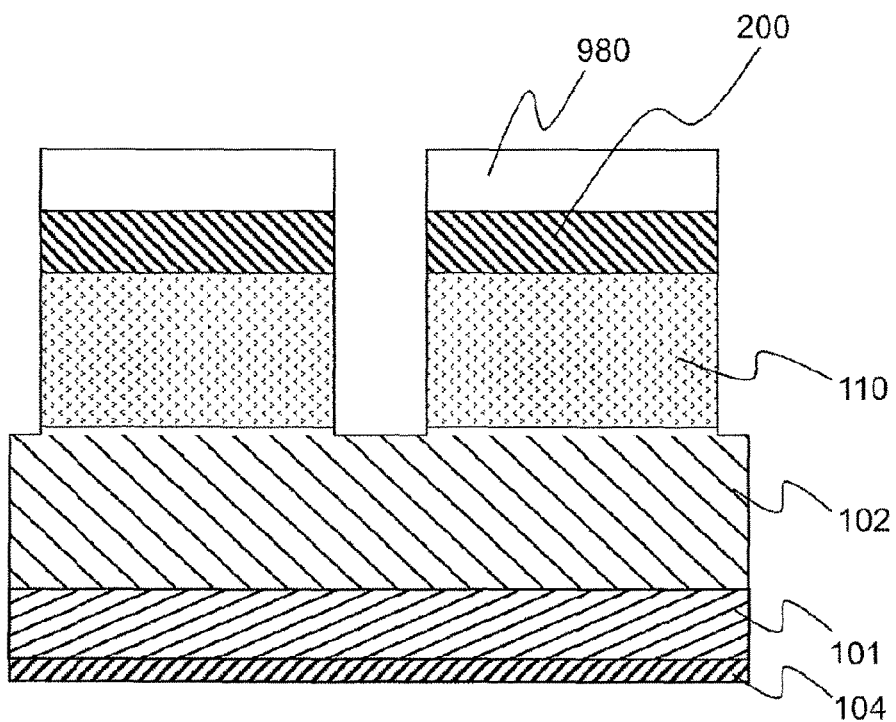

[FIG. 30]
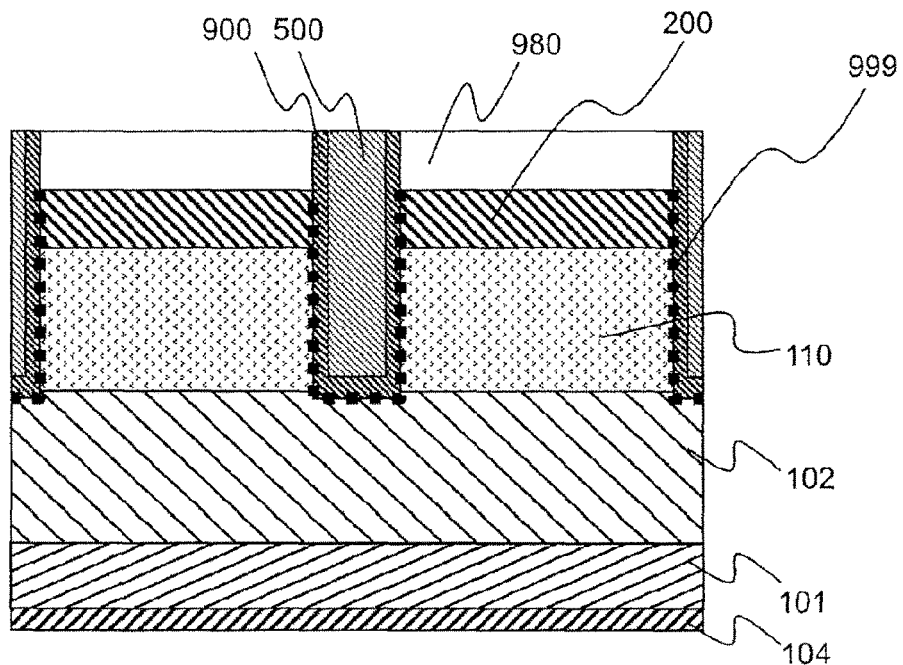
[FIG. 31]
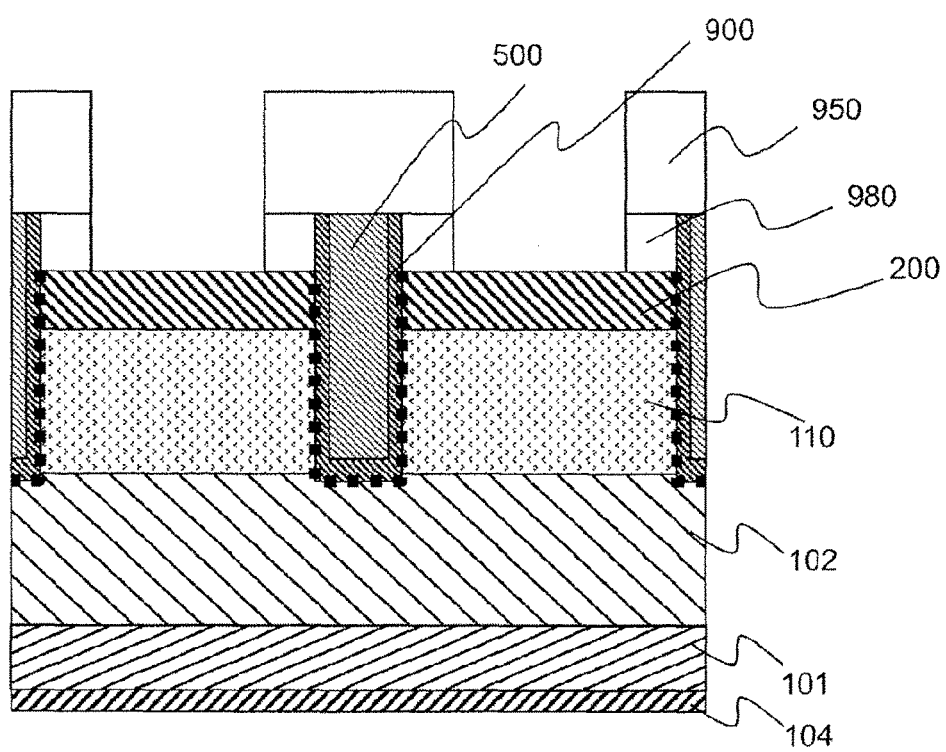

[FIG. 32]
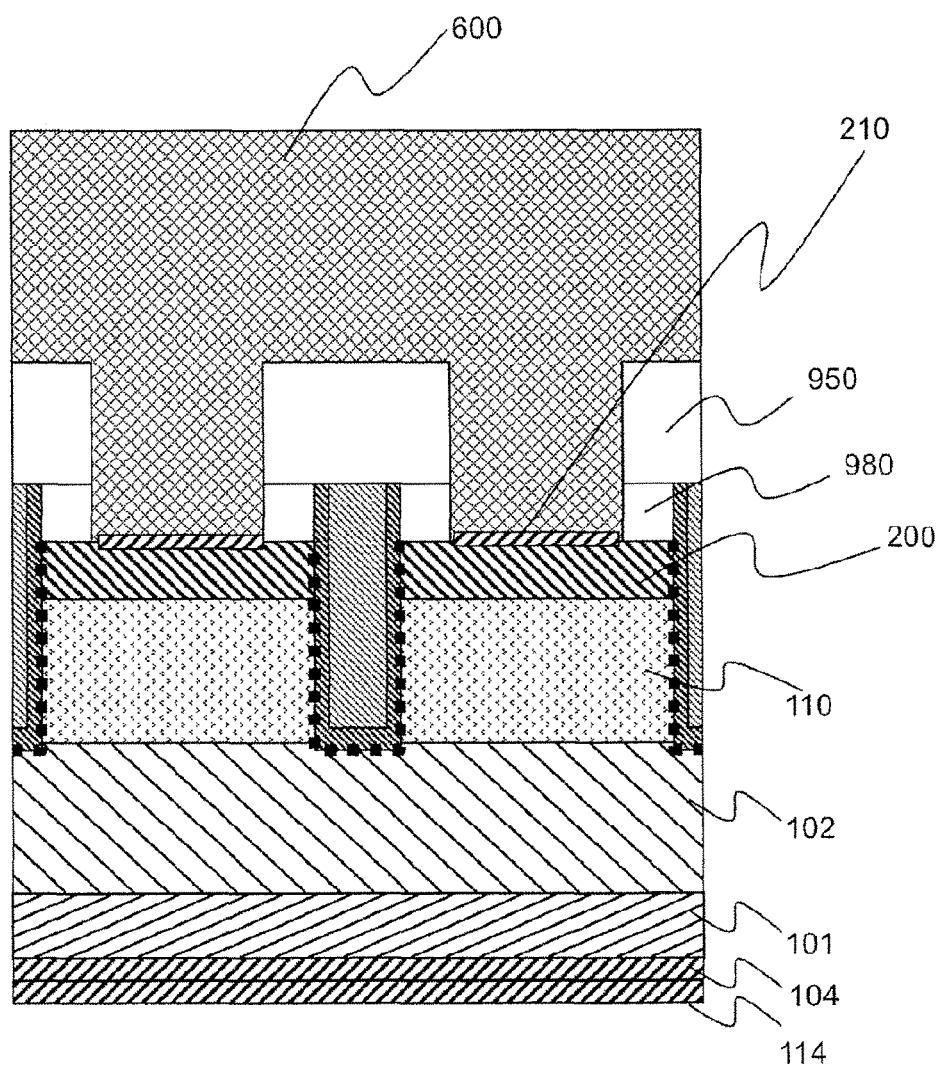

[FIG. 33]
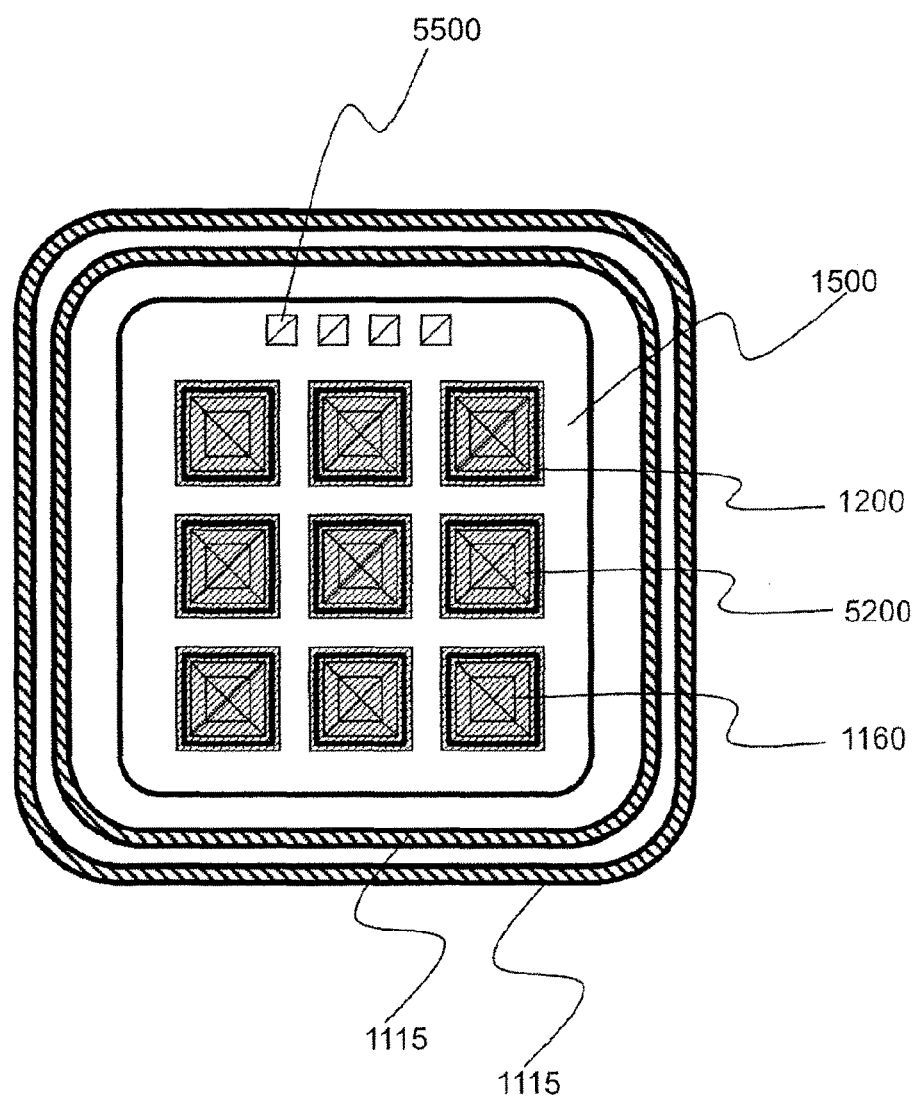

[FIG. 34]
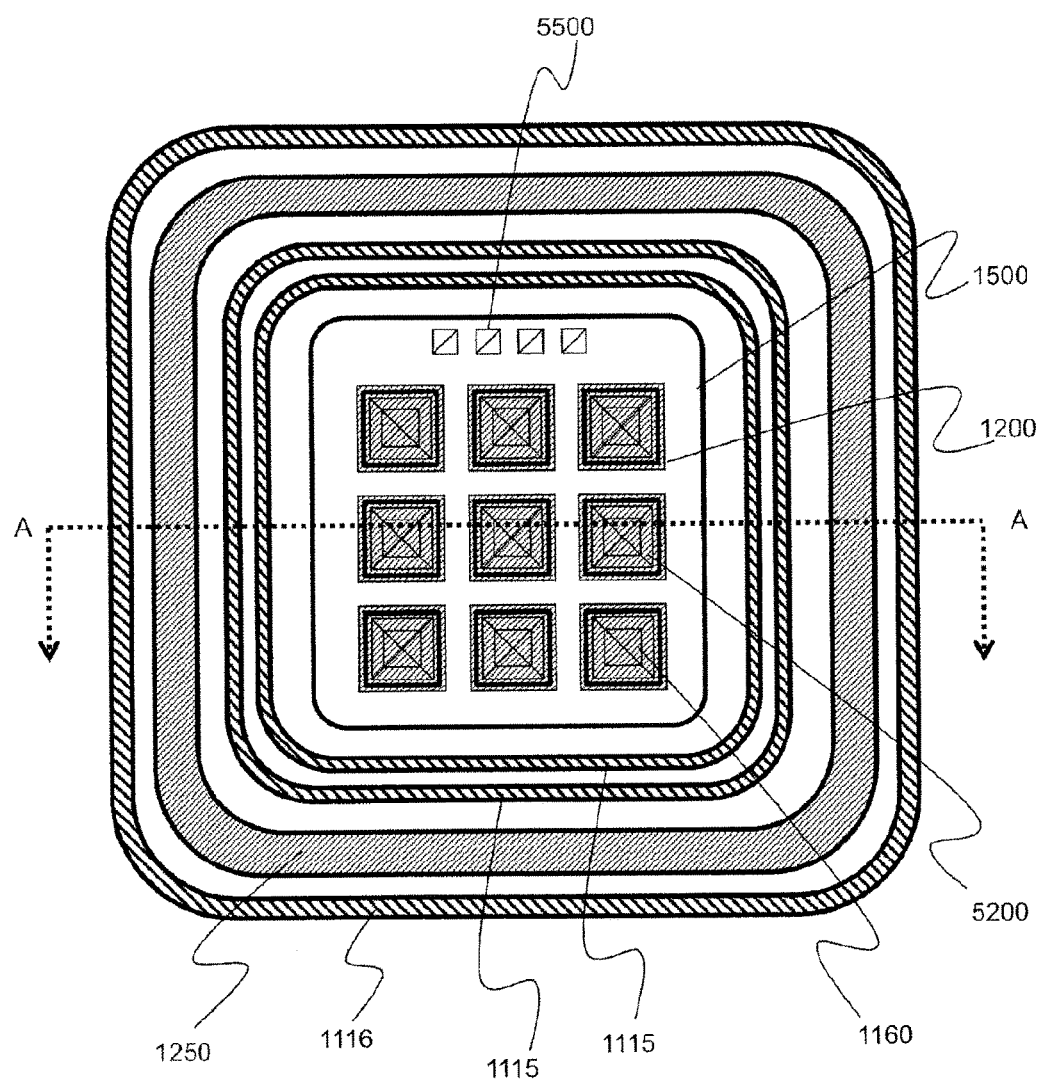

[FIG. 35]
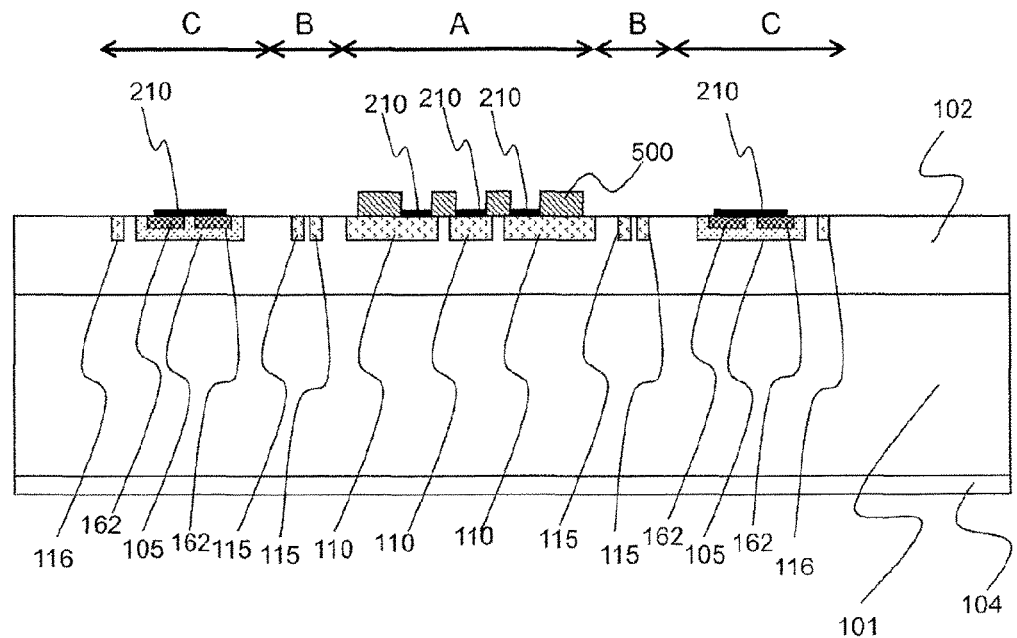
[FIG. 36]
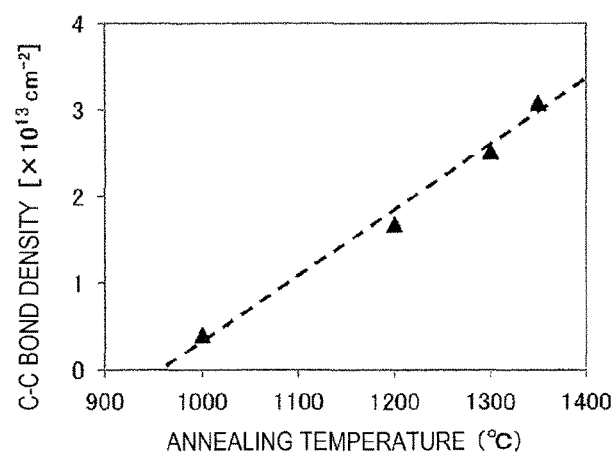

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the same.

BACKGROUND ART

In SiC power MOSFETs fabricated using SiC having 4H crystallinity, channel mobility is known to be lower than that of theoretical prediction.

In the SiC power MOSFET, as a cause for lowering the channel mobility, an interface state or surface roughness at a channel interface, the influence of phonon scattering, or the influence of Coulomb scattering based on fixed charge is considered as a main factor. In particular, when a SiC surface is thermally oxidized to form a gate insulating film (silicon dioxide), a layer containing excessive carbon (hereinafter represented as a carbon-excess layer) is formed as an interface layer between SiC and silicon dioxide in the vicinity of a channel surface, and this carbon-excess layer is known to reduce the carrier mobility in an inversion layer channel (refer to NPL 1). Chokawa et al. have reported that the application of mechanical stress due to oxidation to SiC crystal causes the generation of this carbon-excess layer (refer to NPL 2). FIG. 1 shows an explanatory view of the generation mechanism of the carbon-excess layer. When oxygen combines with silicon in crystal by oxidation, deformation occurs in a crystal layer in the vicinity of an interface. Therefore, carbon atoms in SiC crystal below the interface approach each other, form carbon-carbon (C—C) bonds, and thus are stabilized. Since this bond is stable, the formed carbon-carbon bonds continue to remain through a subsequent process, and thereby form the carbon-excess layer. Carbon-carbon bonds present in the vicinity of a channel interface form a trap level and distort an electric potential, thereby causing mobility degradation.

Okada et al. have reported based on analysis using an X-ray photoelectron spectroscopy that carbon-carbon bonds are formed in the vicinity of an interface when a SiC crystal surface having this 4H crystallinity is thermally oxidized (refer to NPLs 3 and 4). It is shown that a large number of carbon-carbon bonds exceeding 10% of silicon-carbon bonds are present by oxidation in a region 2 nm or less below the interface. Moreover, when this carbon-excess layer is formed, this change can be seen by analyzing a crystal structure of the interface using a high-power transmission electron microscope. It is known that when a gate insulating film is formed on a silicon substrate and its interface is observed by the same method, an interface between silicon and an oxide film is formed within the range of about an atomic step. In contrast to this, at an interface between SiC and an oxide film, since a crystal structure is deformed due to carbon-carbon bonds, an interface region is observed to be spread over two to three steps.

CITATION LIST

Non-Patent Literature

NPL 1: T. Zheleva, et al., "Transition layers at the SiO$_2$/SiC interface", Apply Physics Letters 93, 022108 (2008)
NPL 2: K. Chokawa et al., "A New-Type of C—C Defect Generation at a 4H—SiC/SiO$_2$ Interface by Oxidation Induced Compressive Strain," 9 European Conference on Silicon Carbide and Related Materials (ECSCRM2012), We6-3, 2012.
NPL 3: Hazuki Okada et al., "Angle-resolved XPS studies on transition layers at SiO$_2$/SiC interfaces", Spring Meeting 2012 of The Japan Society of Applied Physics, 17a-DP5-1
NPL 4: Hazuki Okada et al., "Estimation of depth profile of C in oxide for SiO$_2$/4H—SiC using HAX-PES", Technical Meeting 2012 of The Japan Society of Applied Physics, 11p-PB2-8

SUMMARY OF INVENTION

Technical Problem

The related arts described above only describe that a SiC MOSFET having excellent operating characteristics cannot be realized because a carbon-excess layer (carbon-carbon bond) at a high concentration is present at an interface between SiC and silicon dioxide, but does not suggest what kind of solving process exists or how much of a reduction in carbon-carbon bonds is needed to enable the suppression of characteristic degradation when manufacturing a semiconductor device.

It is an object of the invention to provide a semiconductor device in which characteristic degradation associated with carbon-carbon bonds is minimized to a practical level.

Solution to Problem

First, the present inventors measured the density of silicon at a channel surface of a MOSFET where the channel surface is a (0001) surface silicon surface of SiC crystal having 4H crystallinity. As a result, the density was about $4 \times 10^{14}$ cm$^{-2}$. Then, the present inventors have experimentally confirmed that it is effective to suppress the density of carbon-carbon bonds in a carbon-excess layer that practically affects device characteristics within about 1% of $4 \times 10^{14}$ cm$^{-2}$. As a result, it is found that if a target for the carbon-carbon bonds (density) is set to $4 \times 10^{12}$ cm$^{-2}$ or less and the carbon-carbon bonds (density) can be suppressed to this level, characteristic degradation of a silicon carbide semiconductor device can be minimized to a substantially negligible extent.

Even conventional approaches can reduce the carbon bond density. However, since a method in which the carbon-carbon bonds (density) are not increased deteriorates film quality, it is not practical.

That is, even when the carbon-carbon bonds (density) are set to $4 \times 10^{12}$ cm$^{-2}$ or less, it does not mean that the carbon-carbon bonds (density) are set to zero but means that the carbon-carbon bonds (density) are minimized to such an extent that characteristic degradation is in effect negligible.

Advantage of the Invention

According to the invention, the on-resistance of a silicon carbide semiconductor device can be reduced.

BRIEF DESCRIPTION OF DRAWINGS

FIG. 1 An explanatory view of a generation mechanism of a carbon-excess layer.
FIG. 2 An explanatory view of a termination mechanism at a SiC interface.

FIG. 3 A planar layout view for explaining a SiC semiconductor device according to Embodiment 1.

FIG. 4 A planar layout view for explaining the SiC semiconductor device according to Embodiment 1.

FIG. 5 A planar layout view for explaining the SiC semiconductor device according to Embodiment 1.

FIG. 6 A planar layout view for explaining the SiC semiconductor device according to Embodiment 1.

FIG. 7 A planar layout view for explaining the SiC semiconductor device according to Embodiment 1.

FIG. 8 A cross-sectional process view for explaining a method for manufacturing the SiC semiconductor device according to Embodiment 1.

FIG. 9 A cross-sectional process view for explaining the method for manufacturing the SiC semiconductor device according to Embodiment 1.

FIG. 10 A cross-sectional process view for explaining the method for manufacturing the SiC semiconductor device according to Embodiment 1.

FIG. 11 A cross-sectional process view for explaining the method for manufacturing the SiC semiconductor device according to Embodiment 1.

FIG. 12 A cross-sectional process view for explaining the method for manufacturing the SiC semiconductor device according to Embodiment 1.

FIG. 13 A cross-sectional process view for explaining the method for manufacturing the SiC semiconductor device according to Embodiment 1.

FIG. 14 A cross-sectional process view for explaining the method for manufacturing the SiC semiconductor device according to Embodiment 1.

FIG. 15 A cross-sectional process view for explaining the method for manufacturing the SiC semiconductor device according to Embodiment 1.

FIG. 16 A planar layout view for explaining a SiC semiconductor device according to Embodiment 2.

FIG. 17 A cross-sectional process view for explaining a method for manufacturing the SiC semiconductor device according to Embodiment 2.

FIG. 18 A cross-sectional process view for explaining the method for manufacturing the SiC semiconductor device according to Embodiment 2.

FIG. 19 A cross-sectional process view for explaining the method for manufacturing the SiC semiconductor device according to Embodiment 2.

FIG. 20 A cross-sectional process view for explaining the method for manufacturing the SiC semiconductor device according to Embodiment 2.

FIG. 21 A cross-sectional process view for explaining a method for manufacturing a SiC semiconductor device according to Embodiment 3.

FIG. 22 A cross-sectional process view for explaining the method for manufacturing the SiC semiconductor device according to Embodiment 3.

FIG. 23 A cross-sectional process view for explaining the method for manufacturing the SiC semiconductor device according to Embodiment 3.

FIG. 24 A cross-sectional process view for explaining the method for manufacturing the SiC semiconductor device according to Embodiment 3.

FIG. 25 A cross-sectional process view for explaining the method for manufacturing the SiC semiconductor device according to Embodiment 3.

FIG. 26 A cross-sectional process view for explaining the method for manufacturing the SiC semiconductor device according to Embodiment 3.

FIG. 27 A planar layout view for explaining a SiC semiconductor device according to Embodiment 4.

FIG. 28 A cross-sectional process view for explaining a method for manufacturing the SiC semiconductor device according to Embodiment 4.

FIG. 29 A cross-sectional process view for explaining the method for manufacturing the SiC semiconductor device according to Embodiment 4.

FIG. 30 A cross-sectional process view for explaining the method for manufacturing the SiC semiconductor device according to Embodiment 4.

FIG. 31 A cross-sectional process view for explaining the method for manufacturing the SiC semiconductor device according to Embodiment 4.

FIG. 32 A cross-sectional process view for explaining the method for manufacturing the SiC semiconductor device according to Embodiment 4.

FIG. 33 A planar layout view for explaining the arrangement of a SiC semiconductor device according to Embodiment 5.

FIG. 34 A planar layout view for explaining the arrangement of the SiC semiconductor device according to Embodiment 5.

FIG. 35 A cross-sectional process view for explaining a method for manufacturing the SiC semiconductor device according to Embodiment 5.

FIG. 36 A graph showing a relation between the temperature and the amount of C—C bonds in a nitrogen termination treatment.

DESCRIPTION OF EMBODIMENTS

As described above, a feature of the invention resides in that a (0001) surface silicon surface of SiC crystal having 4H crystallinity is used as a channel surface of a MOSFET and carbon-carbon bonds (density) at $4 \times 10^{12}$ cm$^{-2}$ or less are provided in a carbon-excess layer.

In order to realize this structure, the present inventors have realized a process for forming a gate insulating film by the following three approaches:

(1) Removing a layer containing carbon-carbon bonds before forming the gate insulating film;

(2) Forming the gate insulating film by a chemical deposition method; and (3) Subjecting an interface between a crystal surface and the insulating film to a nitriding termination treatment at a low temperature for a short time.

Basic functions of constituent elements of the invention will be described below.

(1) Forming and Removing a Layer Containing Carbon-Carbon Bonds Before Forming a Gate Insulating Film In order to realize an active layer with high characteristics using SiC, a high-temperature activation heat treatment process is required, and therefore, the application of mechanical stress is unavoidable. Therefore, a carbon-excess layer is characteristically inevitably formed (refer to FIG. 1). Therefore, this carbon-excess layer is removed. It is generally known that an etching technique mainly using a chemical reaction does not damage a substrate after etching removal. For example, in etching of a SiC surface, vapor-phase etching using hydrogen makes it possible to perform etching without damage. Since this carbon-excess layer is considered to be 2 nm or less, the influence of the carbon-excess layer can be eliminated by removing about 10 nm of the layer by etching.

(2) Forming the Gate Insulating Film by a Chemical Deposition Method

A silicon oxide film is deposited on a crystal substrate with no carbon-excess layer by a CVD (Chemical Vapor Deposition) method. For example, $SiO_2$ can be deposited by adding $N_2O$ as an oxidant into $SiH_4$. In the deposition of this method, a carbon-excess layer is not formed because mechanical stress is not applied to the substrate crystal, compared to the case of thermally oxidizing a substrate surface.

(3) Subjecting an Interface Between a Crystal Surface and the Insulating Film to a Nitriding Termination Treatment at a Low Temperature for a Short Time In the case of the MOSFET using the silicon surface of SiC having 4H crystallinity as a channel, when an oxide film is deposited on the crystal surface, many interface traps or interface states are generated because a large number of dangling bonds remain due to unpaired electrons of silicon atoms at the crystal surface. Therefore, when, after depositing a silicon oxide film, a surface treatment is performed by heating, for example, nitric monoxide (NO), nitric monoxide passes through the deposited film and the treatment of a substrate interface can be performed. That is, by forming silicon-oxygen bonds or silicon-nitrogen bonds at the interface, a silicon oxide film or a silicon oxynitride film can be formed. Different from the case of forming more stable bonds by cutting already present bonds by a usual oxidation reaction at a substrate surface, this reaction brings about a situation close to a state where dangling bonds are simply terminated because interface dangling bonds are labile. The state is schematically shown in FIG. 2. Usually, "termination" means a reaction state where hydrogen atoms or the like are bonded to dangling bonds to thereby eliminate an unpaired pair of electrons. Here, however, the expression "termination" is used in a broad sense, meaning that dangling bonds are eliminated without cutting substrate bonding. Bonded oxygen is bonded to, for example, silicon in the deposited film to forma silicon oxide film, thereby being stabilized. Moreover, the oxygen is bonded to nitrogen bonded to silicon in the substrate to form a silicon oxynitride film, thereby being stabilized. In order to more effectively promote this reaction, it is effective to set a silicon composition ratio of the silicon oxide film to be deposited in the vicinity of the interface into a silicon-rich state where a silicon concentration is increased more than that of an ideal stoichiometric proportion state (Stoichiometry). Moreover, some dangling bonds form silicon-nitrogen bonds and are terminated. Therefore, the generation of an interface state or the like is not caused. FIG. 2 schematically shows the state of a SiC interface after depositing a silicon oxide film. A CVD film (deposited silicon oxide film) is shown on the upper side of the broken line, while a SiC substrate is shown on the lower side. A state where oxygen or nitrogen is bonded to silicon dangling bonds at a SiC surface is shown. Moreover, a state where the oxygen or nitrogen bonded to the dangling bonds is bonded to Si in the CVD film and thus stabilized is shown. Since oxygen is bonded to silicon in the deposited oxide film as described above, an interface with no dangling bonds can be formed without deforming a crystal structure. Since the termination treatment of dangling bonds described above is a reaction on the outermost surface, the film thickness to be formed corresponds to two- to three-atomic layer, or about 5 A (angstrom) as a physical thickness.

By forming a termination treatment layer at an interface with this oxide film or oxynitride film, dangling bonds can be effectively eliminated.

FIG. 36 shows the relation of carbon-carbon bonds obtained when using vapor-phase etching using hydrogen as (1) described above, forming a silicon oxynitride film with 50 nm thickness by deposition through CVD in (2), and performing a nitrogen termination treatment in a nitric monoxide atmosphere at multiple temperatures just for 30 minutes in (3). The density in a carbon-excess layer is $31 \times 10^{12}$ $cm^{-2}$ at 1350° C.; the density in the carbon-excess layer is $25 \times 10^{12}$ $cm^{-2}$ at 1300° C.; and the density in the carbon-excess layer is $17 \times 10^{12}$ $cm^{-2}$ at 1200° C. Then, it was found that the carbon-carbon bonds in the carbon-excess layer can be suppressed to $5 \times 10^{12}$ $cm^{-2}$ or less in the case of 1000° C. As shown in the following embodiments, it was found that the carbon-carbon bonds in the carbon-excess layer can be suppressed to $4 \times 10^{12}$ $cm^{-2}$ or less further by setting the heating time to 10 minutes or less.

Embodiment 1

Hereinafter, Embodiment 1 will be described in detail with reference to the drawings. FIGS. 3 to 7 are layout views each showing a typical planar layout of layers when forming a MOSFET using a planar process. FIG. 3 shows an example using square basic cells, and FIG. 4 shows an example using rectangular basic cells. In both of FIGS. 3 and 4, 1500 shown by heavy lines indicates gate electrodes, and source diffusion layer electrodes 1200, a $P^+$ diffusion layer 1160 for feeding power to P-wells 1110, and contact holes 5200 to sources and wells are placed. The drawings show a state where the basic cells are arranged in an array, and in both of the drawings, a similar, typical cross-section of the element appears in an A-A cross-section. FIG. 5 shows another planar layout. In FIG. 3, the gate electrodes are arranged so as to orthogonally intersect each other. In this case, there is a problem that a gate length is diagonally increased at an orthogonal intersection point. By shifting the arrangement of the gates every other column as shown in FIG. 5, orthogonal regions do not appear, so that it is possible to prevent the generation of the region with a long diagonal length. Moreover, as shown in FIG. 6, a rectangle with a different aspect ratio can be used as a basic cell. In this case, since a plurality of contacts can be placed, it is possible to reduce a reduction in manufacturing yield due to faulty electrical continuity of the contacts. In FIG. 6, the source diffusion layer is omitted for understanding the state of contacts. Moreover, in FIG. 7, the contact area with the source diffusion layer is increased when forming a plurality of contacts. Due to this, a large current path can be ensured in a basic cell. As can be seen from the fact that the same structure as that of the A-A cross-section in FIG. 3 appears in A-A cross-sections of FIGS. 5 to 7, only planar layouts are different from each other, and therefore, the same manufacturing process can be used. Hereinafter, the manufacturing process will be described using FIGS. 8 to 15 with A-A cross-sections. Here, a description will be made in conjunction with using an NMOS, but it is of course possible to form a PMOS in the same manner by changing the conductivity type of an impurity.

First, an epitaxial layer 102 containing a low concentration of n-type impurity is formed on a SiC substrate 101 containing a high concentration of N-type impurity. Specifically, the N-type impurity is, for example, nitrogen, and the impurity concentration is in the range of $1 \times 10^{18}$ to $1 \times 10^{21}$ $cm^{-3}$. Here, a Si surface of the 4H—SiC substrate 101 is used.

On this SiC substrate 101, the $N^-$-type epitaxial layer 102 of SiC into which the N-type impurity at a lower concentration than the SiC substrate 101 is implanted is epitaxially grown. The impurity concentration of this n⁻-type epitaxial layer 101 depends on the device rating of a SiC semiconductor device, and is in the range of, for example, $1 \times 10^{14}$ to $1 \times 10^{17}$ cm$^{-3}$. Through the process described above, a SiC epitaxial substrate is completed. (FIG. 8)

A P-type well layer 110 obtained by ion-implanting aluminum (Al) as a P-type impurity is formed in the layer 102. The depth of the P-well layer is as deep as 0.5 to 2 µm, and in general, the injection energy ranges from several hundred keV to several MeV. Therefore, a hard mask such as SiO₂ (silicon oxide) is generally used as a mask using the pattern 1110 in FIG. 3. First, a SiO₂ film is deposited to a thickness of about 1 to 3 µm by a plasma CVD (chemical vapor deposition) apparatus. Next, a positive resist is applied, exposed, and developed to form a resist pattern having a shape of a desired body layer. Thereafter, the SiO₂ film is processed by dry etching, and the resist is removed, whereby the patterned mask is formed on the SiC epitaxial substrate 102. At this time, at a terminal end portion of the SiC semiconductor device, a portion where the P-well layer is not formed is covered with a mask, so that a breakdown-voltage structure at the terminal end is formed. For example, a publicly known FLR (Floating field Limited Ring) structure or the like can be used. As the structure of the terminal end portion, other structures may also be employed. For example, there is a JTE (Junction Termination Extention) structure. Subsequently, the P-well layer 110 is formed by ion implantation. The impurity is, for example, B (boron) or Al (aluminum). The impurity concentration is in the range of, for example, $1 \times 10^{16}$ to $1 \times 10^{19}$ cm$^{-3}$.

Further, in order to fix the potential of the P-well layer 110, a P' layer 160 is provided using the pattern 1160 in FIG. 3. First, a SiO₂ film is deposited by a plasma CVD apparatus. Next, a positive resist is applied, exposed, and developed to form a resist pattern having a shape of a desired body layer. Thereafter, the SiO₂ film is processed by dry etching, and the resist is removed, whereby the patterned mask is formed on the SiC epitaxial substrate. Subsequently, the P⁺ layer 160 is formed by ion implantation. The impurity is, for example, Al. The impurity concentration is in the range of, for example, $1 \times 10^{19}$ to $1 \times 10^{21}$ cm$^{-3}$.

Next, an N⁺ layer 200 serving as a source electrode is provided using the pattern 1200 in FIG. 3. First, a SiO₂ film is deposited by a plasma CVD apparatus. Next, a positive resist is applied, exposed, and developed to form a resist pattern having a shape of a desired source layer. Thereafter, the SiO₂ film is processed by dry etching, and the resist is removed, whereby the patterned mask is formed on the SiC epitaxial substrate. Subsequently, the N⁺ layer 200 is formed by ion implantation. The impurity is, for example, nitrogen. The impurity concentration is in the range of, for example, $1 \times 10^{19}$ to $1 \times 10^{21}$ cm$^{-3}$.

Next, a guard ring is provided around the SiC semiconductor device for the terminal end. First, a SiO₂ film is deposited by a plasma CVD apparatus. Next, a positive resist is applied, exposed, and developed to form a resist pattern having a shape of a desired guard ring. Thereafter, the SiO₂ film is processed by dry etching, and the resist is removed, whereby the patterned mask is formed on the SiC epitaxial substrate. Subsequently, the guard ring is formed by ion implantation. The impurity is, for example, nitrogen. The impurity concentration is in the range of, for example, $1 \times 10^{19}$ to $1 \times 10^{21}$ cm$^{-3}$. At this time, an impurity profile can be designed to obtain a desired device rating.

Here, by ion implanting an impurity into a channel region surface, the threshold of the MOSFET can be set to a desired value. For example, in the case of lowering the threshold and obtaining a large current, an N-type impurity (for example, nitrogen) is introduced into the surface of the layer 110. In a conventional structure, a so-called "buried-channel" structure has been used, in which the layer 110 is inverted into an N-type in the vicinity of the surface by implanting a large amount of N-type impurity, compared to the P-type impurity contained in the layer 110, for improving low interface mobility. In the buried channel, carriers flow relatively inside the substrate compared to a usual inversion layer channel, and therefore, a feature of capable of reducing the influence on an interface is utilized. However, it is known that a malfunction is likely to occur due to the low threshold, that a leakage current is increased in an off state, that channel controllability with a gate is degraded, and further that it is difficult to shorten a channel or that switching characteristics are degraded. In the structure of the invention, since favorable interface characteristics are obtained, mobility degradation or the like does not occur even when a channel is formed in an inversion layer. Therefore, a high-threshold element can be obtained by increasing the P-type impurity concentration in the channel. Moreover, when a gate insulating film thickness is reduced, the threshold is lowered, and therefore, it is difficult to ensure a sufficiently high threshold so as to prevent a malfunction. According to the structure of the invention, however, since such a problem does not occur, it is possible to increase the degree of freedom of design of a threshold and a gate insulating film thickness.

Hereinafter, a description will be first made using a structure without N-type inversion, but the method of the invention can be applied similarly to a buried-channel structure.

After introducing the impurities on the surface (front surface) side, an N-type impurity at a high concentration is introduced into a back surface to thereby form a high-concentration layer 104, so that the parasitic resistance of a drain electrode contact formed on the back surface can be lowered. The impurity is, for example, nitrogen. The impurity concentration is in the range of, for example, $1 \times 10^{20}$ to $1 \times 10^{21}$ cm$^{-3}$.

After implanting all the impurities, the implanted impurities are activated. For an activation heat treatment of SiC, a temperature of 1500° C. or more is required. However, when the temperature exceeds 1500° C., the separation of Si atoms or the implanted impurities occurs from the SiC substrate surface. Moreover, surface flatness is degraded. Therefore, the front and back surfaces of the SiC epitaxial substrate are coated with a carbon film before the activation heat treatment. The carbon film is deposited to a thickness of about 30 nm on the front and back surfaces of the SiC epitaxial substrate by a plasma CVD apparatus. After coating the carbon films, the activation heat treatment is performed at a high temperature of 1500° C. or more for several minutes. After the activation heat treatment, the coated carbon films are removed by oxygen plasma. (FIG. 9)

After removing a natural oxide film and exposing the substrate surface in an ultrahigh vacuum state, vapor-phase etching is performed by exposure to hydrogen gas at a high temperature of 1300° C., so that about 20 nm of the substrate surface is removed. At this time, a carbon-excess layer that is formed in the processes so far is simultaneously removed. In this hydrogen etching, it is known that if an under layer has suffered damage, partial etching occurs to form irregularities on the substrate surface. Therefore, the formation of irregularities in a region serving as a channel degrades mobility, which is not desirable. Therefore, when the P-well layer 110 serving as a channel, which has been described with reference to FIG. 9, is formed, boron, which is lighter compared to aluminum, is used as a dopant to a channel at least in the vicinity of the substrate surface, so that it is possible to reduce the influence on the substrate crystal at the time of ion implantation. Therefore, it is possible, by using boron, to form an element having excellent surface flatness.

Before performing hydrogen etching, it is also possible to clean the substrate surface by thermally oxidizing about 5 nm of the substrate surface and etching an oxide film with a cleaning liquid using hydrofluoric acid. With this sacrificial oxidation process, a carbon-excess layer is formed on the substrate surface, but thereafter, the carbon-excess layer can be removed by the hydrogen etching process.

A silicon oxide film 900 serving as a gate insulating film is deposited to a thickness of 50 nm using $SiH_4$ and $N_2O$ as a source gas by a CVD method at 700° C. This temperature can be said to be a sufficiently low temperature for SiC because a temperature of about 1200° C. is generally used for oxidizing a SiC crystal surface. (FIG. 10)

After depositing the oxide film by a CVD method, the oxide film is exposed to nitric monoxide (NO) at 1000° C. for 100 seconds to perform termination of an interface. A termination layer is indicated by 999. Since the silicon oxide film deposited by a CVD method has a lower film density compared to that of a thermal oxide film, NO serving as an oxidant passes through the silicon oxide film and can be bonded to dangling bonds remaining at the interface. Moreover, by performing this heat treatment, an unstable site such as an unreacted bond in the film is subjected to repair such as oxidation even for a short time, so that the film quality of the deposited film can also be altered. (FIG. 11)

A polycrystalline silicon obtained by in-situ doping phosphorus at a concentration of $5 \times 10^{20}$ cm$^{-3}$ is deposited to a thickness of 300 nm. The polycrystalline silicon is patterned using the gate pattern 1500 in FIG. 3 and anisotropically etched to thereby form a gate electrode. (FIG. 12)

An interlayer insulating film 950 is deposited to a thickness of 500 nm, and the contact portion indicated by 5200 in FIG. 3 is opened. A silicide layer 210 is formed on the source electrode 200 and the P$^+$ diffusion layer 160 that are opened, so that a contact resistance with metal wiring can be reduced. Nickel is deposited to a thickness of 50 nm by a sputtering method, and a heat treatment is applied thereto as first annealing at 700° C. for 60 seconds, so that a silicidation reaction is performed with the polycrystalline silicon 210. An unreacted metal is removed using a mixed solution of sulfuric acid and hydrogen peroxide, and thereafter, a heat treatment is performed as second annealing at 1000° C. for 60 seconds to cause a reaction to occur, so that the desired nickel silicide layer 210 is formed. (FIG. 13)

Although not shown in the drawing, a contact to the gate electrode 500 is opened. Aluminum is deposited to a thickness of 2 microns by the sputtering method and patterned to thereby form metal wiring 600. Before depositing aluminum, a barrier metal such as Ti or TiN can be deposited and interposed between aluminum and the silicide layer. These wiring and subsequent processes are performed by an already-known semiconductor device process, whereby the semiconductor device of the invention can be obtained. (FIG. 14)

After forming the wiring on the front surface side, nickel is deposited to a thickness of 70 nm on the back surface and subjected to laser annealing, so that a silicide layer 114 can be formed. Due to this, the contact resistance between the metal wiring and the semiconductor layer can be reduced.

After forming the silicide, a stacked film (not shown in the drawing) of titanium, nickel, and gold is formed by a sputtering method, so that the back surface and the wiring of the drain electrode are completed. (FIG. 15)

Power is fed through the drain electrode contact of the substrate lower surface 114 to the high-concentration layer 104, the substrate 101, and the epitaxial layer 102, and the P-well 110 region substrate surface between the epitaxial layer 102 and the source electrode 210 is controlled by an electric field effect caused by the gate electrode 500 via the gate insulating film 900, so that the transistor action of the MOSFET can be achieved.

In the element formed by this manufacturing process, since the channel interface is not subjected to an oxidation process, a carbon-excess layer is not formed. Therefore, it is possible to obtain an element capable of realizing high mobility and having a low on-resistance and favorable operating characteristics.

Embodiment 2

A method for manufacturing another structure will be described using FIGS. 16 to 20. FIG. 16 shows a planar layout. FIGS. 17 to 20 show the manufacturing method, which is alternative to the manufacturing method shown in and after FIG. 10 in Embodiment 1, and the structure, with an A-A cross-section in FIG. 16. An interlayer insulating film is interposed, in an overlapping region of the source diffusion layer and the gate electrode used in Embodiment 1, using a pattern indicated by 1501 in FIG. 16, so that a breakdown voltage between the source and the gate can be improved, and the parasitic capacitance can be reduced.

After removing the carbon-excess layer shown in FIG. 9, a silicon oxide film 980 serving as an interlayer insulating film is formed on the entire surface of the substrate. This can be performed by depositing TEOS as a raw material to a thickness of 300 nm by a CVD method. Baking at about 900° C. can be performed as necessary. In this case, the film is an oxide film deposited on the entire surface, and an oxidizing atmosphere is not provided, and therefore, the occurrence of mechanical stress is never a problem. (FIG. 17)

The interlayer film 980 is opened using the pattern 1501 in FIG. 16 so as to expose the source electrode 200 in a channel direction, and a silicon oxide film 900 serving as a gate insulating film is deposited to a thickness of 50 nm using $SiH_4$ and $N_2O$ as a source gas by a CVD method at 750° C. When exposing the channel, damage to the substrate can be avoided by using wet etching. This temperature can be said to be a sufficiently low temperature for SiC because a temperature of about 1200° C. is generally used for oxidizing a SiC crystal surface. After depositing the oxide film by a CVD method, the oxide film is exposed to nitric monoxide (NO) at 1000° C. for 100 seconds to perform a termination treatment of a SiC interface. A termination layer is indicated by 999. Since the silicon oxide film deposited by a CVD method has a lower film density compared to that of a thermal oxide film, NO serving as an oxidant passes through the silicon oxide film and can be bonded to dangling bonds remaining at the interface. Moreover, by performing this heat treatment, an unstable site such as an unreacted bond in the film is subjected to repair such as oxidation even for a short time, so that the film quality of the deposited film can also be altered.

Although the manufacturing method described above is the same as that shown in Embodiment 1, there is a method in which the formation of the oxide film is performed without resorting to deposition. After removing the carbon-excess layer and exposing the channel portion, 5 nm of a polycrystalline silicon layer is deposited by a CVD method, and thereafter, only the deposited polycrystalline silicon is oxidized by an ISSG (In-situ Steam Generation) method. In this case, since ISSG has high reactivity, SiC is not oxidized but only dangling bonds can be terminated. After this treatment, a gate insulating film is deposited by a CVD method to obtain a desired oxide film thickness. Before and after the deposition of this CVD film, an interface treatment using NO may be additionally performed. (FIG. 18)

A polycrystalline silicon obtained by in-situ doping phosphorus at a concentration of $5\times10^{20}$ cm$^{-3}$ is deposited to a thickness of 300 nm. The polycrystalline silicon is patterned using the gate pattern 1500 in FIG. 16 and anisotropically etched to thereby form a gate electrode. At this time, since the pattern to be processed is placed on the interlayer film 980, the substrate surface is not damaged even when the process results in overetching. Here, a state where sufficient overetching is performed and the process reaches the oxide film 900 is shown. An interlayer insulating film 950 is deposited to a thickness of 500 nm, and a contact portion indicated by 5200 in FIG. 16 is opened. A silicide layer 210 is formed on the source electrode 200 and the P$^+$ diffusion layer 160 that are opened, so that a contact resistance with metal wiring can be reduced. Nickel 610 is deposited to a thickness of 50 nm by a sputtering method, and a heat treatment is applied thereto as first annealing at 700° C. for 60 seconds, so that a silicidation reaction is performed with the polycrystalline silicon 210. An unreacted metal is removed using a mixed solution of sulfuric acid and hydrogen peroxide, and thereafter, a heat treatment is performed as second annealing at 1000° C. for 60 seconds to cause a reaction to occur, so that the desired nickel silicide layer 210 is formed. (FIG. 19)

By performing the wiring processes shown in FIGS. 14 and 15, a desired element structure can be obtained. (FIG. 20)

This structure has advantageous effects that the gate process is facilitated, and that the parasitic capacitance can be reduced.

Embodiment 3

An example in which the removal of a carbon-excess layer is performed on the entire surface of a wafer has been shown so far, but the removal can be performed only at a channel interface. The manufacturing method will be described using FIGS. 21 to 26.

An impurity diffusion layer is formed by the processes shown in FIGS. 8 and 9. (FIG. 21)

After depositing a polycrystalline silicon 501 to a thickness of 400 nm by a CVD method, a silicon oxide film 971 is deposited to a thickness of 100 nm. Patterning is performed using the pattern 1501 in FIG. 16. (FIG. 22)

By depositing a silicon oxide film 960 to a thickness of 50 nm and performing an anisotropic dry etching process, a sidewall 960 is formed on a side surface of the polycrystalline silicon 501 and the silicon oxide film 971 that are stacked on each other. A silicide 210 is formed on the diffusion layers 200 and 160 that are opened. This process is the same as that shown in FIG. 13. (FIG. 23)

After depositing a silicon oxide film 950 to a thickness of 700 nm, planarization is performed by a CMP (Chemical-mechanical Polishing) method until the top of the polycrystalline silicon 501 is exposed. The exposed polycrystalline silicon 501 is removed by wet etching using hydrofluoric nitric acid to expose a channel portion. (FIG. 24)

By etching 20 nm of the exposed SiC surface using SF$_6$, a carbon-excess layer is removed. Subsequently, the same process as that shown in FIG. 18 is employed, so that the gate insulating film 900, the interface treatment layer 999, and the gate electrode 500 can be deposited. Thereafter, by performing planarization by a CMP method, the gate electrode can be processed into the shape of the gate pattern 1500. (FIG. 25)

By performing the wiring processes shown in FIGS. 14 and 15, a desired element structure can be obtained. (FIG. 26)

In this method, an element can be formed by performing etching only on the channel portion of the SiC surface.

Embodiment 4

Embodiment 4 shows the case where Embodiment 1 and Embodiment 2 are applied to a trench-type cell. In a conventional DMOS, a current flows on the substrate surface in the horizontal direction and then needs to flow through a region interposed between P-wells, which causes a large parasitic resistance. In a trench gate, since a current flows only in the vertical direction from a source to a drain electrode, such a parasitic resistance is not caused. Therefore, there are advantages that the parasitic resistance can be lowered, and that the layout area can be reduced. FIG. 27 shows a planar layout example, and the manufacturing process will be described using FIGS. 28 to 32.

In the layout in FIG. 27, P-well power feeding portions 5160 are disposed separately from the source electrodes 5200.

A P-well 110, a source 200, a P$^+$ diffusion layer 160 (not shown), and a drain high-concentration layer 104 are formed by an ion implantation method, and 1000 nm of a silicon oxide film 980 is deposited by a CVD method. (FIG. 28)

A trench is formed by etching the silicon oxide film 980 and the SiC substrate using the gate pattern 1500. At this time, the process is performed deeper than the bottom of the P-well 110. (FIG. 29)

A carbon-excess layer is not present on a surface formed by the trench process. Therefore, a gate electrode process is performed by forming a gate insulating film 900, a termination treatment layer 999, and a gate electrode 500 by the processes in FIGS. 11 and 12, and performing planarization by a CMP method. (FIG. 30)

An interlayer insulating film 950 is deposited to a thickness of 500 nm, and the contact portions indicated by 5200 and 5160 in FIG. 27 are opened. (FIG. 31)

A silicide 210 is formed in the opened contact portions in the same manner as in Embodiment 1, and a contact (not shown) to the gate electrode is opened. Thereafter, by performing a wiring process in the same manner as in Embodiment 1, a desired element can be obtained. (FIG. 32)

Even for a trench-type power MOSFET, an element including an interface treatment layer can be formed by this embodiment.

Embodiment 5

When constituting an inverter using the structure of the invention, a diode needed for combining with a MOSFET can be formed simultaneously with the MOSFET.

First, FIG. 33 shows a layout of a MOSFET element using the structure of this embodiment. Here, an arrangement example of basic cells and an outer periphery around the basic cells is shown. Double guard bands 1115 are disposed at the outer periphery of the basic cells in an array. An electric field at a terminal end portion is relaxed by the guard bands. FIG. 34 shows an example in which a Schottky barrier diode is formed outside the guard bands at the terminal end portion of the element shown in FIG. 33. The arrangement of a metal electrode layer 1250 is shown. Moreover, a guard band 1116 for maintaining the breakdown voltage of the diode portion is provided at an outer periphery around the metal electrode layer. FIG. 35 shows an element structure of an A-A cross-section in FIG. 34. In the drawing, A shows a MOSFET region; B shows a guard band region of the MOSFET; and C shows a Schottky diode region. For showing the arrangement of these elements, a gate 500 and silicide electrodes 210 are shown. Moreover, the configuration of a diffusion layer is also shown together. 110 indicates P-wells of the MOSFET; 115 indicates P-wells for the guard bands of the MOSFET; 116 indicates a P-well of the guard band of the diode; 105 indicates a surface N-type diffusion layer region for the Schottky barrier diode; and 162 indicates P$^+$ regions for diode protection. Here, although only two P$^+$ regions for protection are depicted on each side, a publicly known configuration method of Schottky barrier diodes disposed in an array can be used in this region. The diode metal electrode 210 can be formed simultaneously with the source electrode of the MOSFET.

REFERENCE SIGNS LIST

101 . . . 4H—SiC substrate
102 . . . SiC epitaxial layer
104 . . . drain diffusion layer region
105, 111 . . . N-type diffusion layer
110, 115, 116 . . . P-well
160, 162 . . . P-type diffusion layer
200 . . . source
114, 210 . . . silicide layer
500 . . . gate
501 . . . polycrystalline silicon
600 . . . metal wiring
900 . . . gate insulating film
999 . . . interface treatment layer
950, 960, 970, 980 . . . silicon oxide film
1110 . . . P-well pattern
1115, 1116 . . . guard band pattern
1160 . . . P$^+$ diffusion layer pattern
1200 . . . source pattern
1500 . . . gate pattern
1600 . . . metal wiring pattern
5160 . . . well contact pattern
5200 . . . source contact pattern
5500 . . . gate contact pattern

The invention claimed is:

1. A silicon carbide semiconductor device comprising:
a source region and a channel region that are disposed on an upper surface of a silicon carbide substrate;
a gate insulating film on the channel region; and
an interface termination layer with a thickness of less than 1 nm at an interface between the channel region and the gate insulating film,
wherein a surface of the channel region includes carbon-carbon bonds, and a density of the carbon-carbon bonds per unit plane is $4 \times 10^{12}$ cm$^{-2}$ or less.

2. The silicon carbide semiconductor device according to claim 1, wherein
the interface termination layer is silicon oxynitride.

3. A method for manufacturing a silicon carbide semiconductor device including a source region and a channel region that are disposed on an upper surface of a silicon carbide substrate, a gate insulating film on the channel region, and an interface termination layer with a thickness of less than 1 nm at an interface between the channel region and the gate insulating film, a surface of the channel region including carbon-carbon bonds, and a density of the carbon-carbon bonds per unit plane is $4 \times 10^{12}$ cm$^{-2}$ or less, the method comprising:
a first step of thermally oxidizing surfaces of the source region and the channel region;
a second step of removing carbon-carbon bonds generated at the channel region surface in the first step;
a third step of forming a gate oxide film on the channel region surface by a deposition method in the second step; and
a fourth step of terminating dangling bonds at an interface between the deposited gate oxide film and the channel region in an oxidizing atmosphere containing nitrogen at 1000° C. or less.

4. The method for manufacturing the silicon carbide semiconductor device according to claim 3, wherein
the second step is vapor-phase etching using hydrogen.

5. The method for manufacturing the silicon carbide semiconductor device according to claim 3, wherein
the oxidizing atmosphere containing nitrogen contains nitric monoxide.

* * * * *